US008535761B2

(12) United States Patent
Laine et al.

(10) Patent No.: US 8,535,761 B2
(45) Date of Patent: Sep. 17, 2013

(54) SILSESQUIOXANE DERIVED HARD, HYDROPHOBIC AND THERMALLY STABLE THIN FILMS AND COATINGS FOR TAILORABLE PROTECTIVE AND MULTI-STRUCTURED SURFACES AND INTERFACES

(75) Inventors: Richard M. Laine, Ann Arbor, MI (US); Christopher L. Soles, Germantown, MD (US); David J. Krug, III, Ann Arbor, MI (US); Hyun Wook Ro, Rockville, MD (US); Vera Nikolova Popova-Gueorguieva, Ypsilanti, MI (US)

(73) Assignees: Mayaterials, Inc., Ann Arbor, MI (US); NIST, Gaithersburg, MD (US)

( * ) Notice: Subject to any disclaimer, the term of this patent is extended or adjusted under 35 U.S.C. 154(b) by 476 days.

(21) Appl. No.: 12/705,109

(22) Filed: Feb. 12, 2010

(65) Prior Publication Data
US 2011/0062619 A1    Mar. 17, 2011

Related U.S. Application Data

(60) Provisional application No. 61/152,385, filed on Feb. 13, 2009.

(51) Int. Cl.
*B05D 5/00* (2006.01)
*B05D 5/08* (2006.01)
*C07F 7/00* (2006.01)
*C07F 7/21* (2006.01)

(52) U.S. Cl.
USPC .......... 427/256; 428/447; 427/418; 427/269; 427/419.1; 556/450; 556/459

(58) Field of Classification Search
None
See application file for complete search history.

(56) References Cited

U.S. PATENT DOCUMENTS

2003/0099899 A1* 5/2003 Gronbeck et al. ......... 430/270.1
2005/0112382 A1* 5/2005 Allen et al. ................... 428/447
(Continued)

FOREIGN PATENT DOCUMENTS
WO    WO 2005055306 A1 *  6/2005

OTHER PUBLICATIONS

Ro et al. (High-Modulus Spin-On Organosilicate Glasses for Nanoporous Applications, Adv. Mater. 2007, 19, 705-710, hereinafter Ro et al.).*

(Continued)

*Primary Examiner* — James Lin
*Assistant Examiner* — Francisco Tschen
(74) *Attorney, Agent, or Firm* — Kubotera & Associate LLC

(57) ABSTRACT

A method of forming a coating comprising the steps of dissolving an silsesquioxane (e.g., one that is primarily a cage compound with 8, 10, 12, 14 or related complete cages or with partially condensed cages containing primarily $Si(O)_4$ units in the cage) in a solvent to form an silsesquioxane solution; introducing (e.g., dissolving) an additive in the solution (e.g., the additive being selected from a rare earth compound, an acid, an organic moiety, a precious metal or compound thereof, a transition metal compound, or any combination thereof, or any of their ionic constituents); and optionally mixing a diluent with the solution to form a coating that is applied to a substrate, wherein the resulting coating forms crosslinks between resulting pendant $Si(OH)_x$ groups and a substrate surface. The present invention also contemplates coatings and coated articles consistent with the present teachings.

8 Claims, 16 Drawing Sheets

(56) References Cited

U.S. PATENT DOCUMENTS

| | | | |
|---|---|---|---|
| 2006/0047134 A1* | 3/2006 | Molock et al. | 556/446 |
| 2006/0103029 A1* | 5/2006 | Basheer et al. | 257/778 |
| 2006/0199380 A1* | 9/2006 | Liu et al. | 438/638 |
| 2007/0281242 A1* | 12/2007 | Hu et al. | 430/270.1 |
| 2008/0131822 A1* | 6/2008 | Liao et al. | 430/347 |
| 2009/0012317 A1* | 1/2009 | Laine et al. | 549/215 |

OTHER PUBLICATIONS

Choi et al. "Organic/Inorganic Hybrid Composites from Cubic Silsesquioxanes" J. Am. Chem. Soc. vol. 123, No. 46, pp. 11420-11430, 2001.

Takahashi et al. "New Aminophenylsilsesquioxanes-Synthesis, Properties, and Epoxy Nanocomposites" Aust. J. Chem. 59, pp. 564-570, 2006.

Tamaki et al. "Octa(aminophenyl) Silsequioxane as a Nanoconstruction Site" J. Am. Chem. Soc. vol. 123, No. 49, pp. 12416-12417, 2001.

Asuncion et al. "The Selective Dissolution of Rice Hull Ash to from [OSiO1.5]8[R4N]8(R=Me,CH2CH2OH) Octasilicates. Basic Nanobuilding Blocks and Possible Models of Intermediates Formed During Biosilification Processes" J. Mater. Chem., 15, pp. 2114-2121, 2005.

Richard M. Laine, "Nanobuilding Blocks Based on the [OSiO1.5]x (x=6,8,10) Octasilsequioxanes" J. Mater. Chem., 15, pp. 3725-3744, 2005.

Zhang et al. "Highly Porous Polyhedral Silsequioxane Polymers. Synthesis and Characterization" J. Am. Chem. Soc. vol. 120, No. 33, pp. 8380-8391, 1998.

Chunxin Zhang and Richard M. Laine, "Hydrosilylation of Allyl Alcohol with [HSiMe2OSiO1.5]8: Octa(3-hydroxypropyldimethylsiloxy)octasilsequioxane and Its Octamethacrylate Derivative as Potential Precursors to Hybrid Nanocomposites" J. Am. Chem. Soc. vol. 122, No. 29, pp. 6979-6988, 2000.

Cheng et al. "Neutral Alkoxysilanes from Silica" J. Am. Chem. Soc. vol. 122, No. 41, pp. 10063-10072, 2000.

Sulaiman et al. "Molecules with Perfect Cubic Symmetry as Nanobuilding Blocks for 3-D Assemblies. Elaboration of Octavinylsilsesquioxane. Unusual Luminescence Shifts May Indicate Extended Conjugation Involving the Silsesquioxane Core" Chem. Mater. vol. 20, No. 17, pp. 5563-5573, 2008.

Tamaki et al. "A Polyimide Nanocomposite from Octa(aminophenyl)silsesquioxane" Chem. Mater. vol. 15, No. 3, pp. 793-797, 2003.

Choi et al. "Organic/Inorganic Imide Nanocomposites from Aminophenylsilsesquioxanes" Chem. Mater. vol. 15, No. 17, pp. 3365-3375, 2003.

Costa et al. "Organic/Inorganic Nanocomposites Star Polymers via Atom Transfer Radical Polymerization of Methyl Methacrylate Using Octafunctional Silsesquioxane Cores" Macromolecules, May 10, 2001.

Sulaiman et al. "Tailoring the Global Properties of Nanocomposites. Epoxy Resins with Very Low Coefficients of Thermal Expansion" Macromolecules, vol. 39, No. 16, Aug. 8, 2006.

Asuncion et al. "Silsesquioxane Barrier Materials" Macromolecules, vol. 40, No. 3, pp. 555-562, 2007.

Asuncion et al. "Octaalkynylsilsesquioxanes, Nano Sea Urchin Molecular Building Blocks for 3-D-Nanostrucrues" Macromolecules, vol. 41, No. 21, 2008.

Choi et al. "Organic/Inorganic Hybrid Composites from Cubic Silsesquioxanes. Epoxy Resins of Octa (dimethylsiloxyethylclohexylepoxide) Silsesquioxane" Macromolecules, vol. 36, No. 15, pp. 5666-5682, 2003.

Choi et al. "Toughening of Cubic Silsesquioxane Epoxy Nanocomposites Using Core-Shell Rubber Particles: A Three-Component Hybrid System" Macromolecules, vol. 37, No. 9, pp. 3267-3276, 2004.

Brick et al. "Spherical, Polyfunctional Molecules Using Poly(bromophenylsilsesquioxane)s as Nanoconstruction Sites" Macromolecules, vol. 38, No. 11, pp. 4655-4660, 2005.

Gravel et al. "Octa(3-chloroammoniumpropyl) Octasilsesquioxane" Appl. Organometal. Chem. 13, pp. 329-336, 1999.

Laine et al. "Polyfunctional Cubic Silsesquioxanes as Building Blocks for Organic/Inorganic Hybrids" Appl. Organometal. Chem. 12, pp. 715-723, 1998.

Lin et al. "Charactrization of Epoxy-Functionalized Silsesquioxanes as Potential Underfill Encapsulants" Mat. Res. Soc. Symp. Proc. vol. 519, 1998.

Soles et al. "Structural Evolution of Silsesquioxane-based Organic/Inorganic Nonocomposite Networks" Mat. Res. Soc. Proc. vol. 628, 2000.

Brick et al. "Self-Lubricating Nano-Ball-Bearings" Adv. Mater. 19, pp. 82-86, 2007.

Laine et al. "Organic-Inorganic Nanocomposites with Completely Defined Interfacial Interactions" Adv. Mater. vol. 13, No. 11, Jun. 5, 2001.

Zhang et al. "Synthesis and Caracterizaion of Liquid Crystalline Silsesquioxanes" Chem. Mater. 2001.

Takamura et al. "Completely Discontinuous Organic/Inorganic Hybrid Nanocomposites by Self-Curing of Nanobuilding Blocks Constructed from Reactions of [HMe2SiOSiO1.5]8 with Vinylcyclohexene" Polym. Int. 56: pp. 1378-1391, 2007.

Roll et al. "para-Octaiodophenylsilsesquioxane, [p-IC6H4SiO1.5]8, a Nearly Perfect Nano-Building Block" ACSNANO vol. 2, No. 2, Jan. 31, 2008.

Laine et al. "Perfect and Nearly Perfect Silsesquioxane (SQs) Nanoconstruction Sites and Janus SQs" J Sol-Gel Sci Technol, Jan. 31, 2008.

Kim et al. "Synthesis of Amino-Containing Oligophenylsilsesquioxanes" Polymer, 46, pp. 4515-4524, 2005.

Sellinger et al. "Heck Coupling of Haloaromatics with Octavinylsilsesquioxane: Solution Processable Nanocomposites for Application in Electroluminescent Devices" Chem. Commun., pp. 3700-3702, 2005.

* cited by examiner

| Sample | pattern height (nm) | line-to-space ratio |
|---|---|---|
| SiO2 - mother mold | 123.1 | 1:2.61 |
| TTSE -daughter mold | 104.6 | 2.26:1 |
| PS - imprint | 107.5 | 1:2.24 |

SILSESQUIOXANE DERIVED HARD, HYDROPHOBIC AND THERMALLY STABLE THIN FILMS AND COATINGS FOR TAILORABLE PROTECTIVE AND MULTI-STRUCTURED SURFACES AND INTERFACES

CLAIM OF PRIORITY

The present application claims the benefit of U.S. Provisional Patent Application No. 61/152,385 (filed on Feb. 13, 2009) which is hereby incorporated by reference in its entirety for all purposes.

GOVERNMENT RIGHTS

This invention was made in part with United States of America Government support under United States Army contract W911QY-07-C-0012 and funding at National Institute of Standards and Technology. The United States Government has certain rights in this invention.

FIELD OF THE INVENTION

The present invention pertains to silsesquioxanes, and more particularly to multifunctional silsesquioxanes used to make hard coatings and thin films with tailored properties and tailored structures within the coating or at coating surfaces.

BACKGROUND OF THE INVENTION

Silsesquioxanes (SQs) with formulas that are $[RSiO_{1.5}]_n$ where n=8, 10, 12, 14 or $[RMe_2SiOSiO_{1.5}]_8$ are unique molecules. They can be considered to represent nanometer size silica particles with functionality substantially evenly spaced on their surfaces in all three dimensions. Furthermore, in some instances this functionality can be the same or mixed.

As such, they provide access to nanocomposite materials with control of assembly at nano meter length scales in 1-, 2- or 3-dimensions one nanometer at a time. The silica core provides the rigidity and heat capacity of larger silica particles making these compounds and coatings or thin films made from them quite robust. In principle, the ability to assemble "cubes" nm×nm offers the potential to tailor (e.g. tailor materials properties) at nanometer length scales. Tailoring at such length scales should permit full optimization of global properties on an application-by-application basis and at low cost. It will also aid in obtaining high reproducibility, predictability and therefore effective materials design. Information about the above can be gleaned from one or more of the following references, all of which are hereby incorporated by reference for all purposes:

1. C. Zhang, F. Babonneau, C. Bonhomme, R. M. Laine, C. L. Soles, H. A. Hristov, A. F. Yee, "Highly Porous Polyhedral Silsesquioxane Polymers. Synthesis and Characterization," J. Am. Chem. Soc. 120, 8380-91 (1998).
2. R. M. Laine, C. Zhang, A. Sellinger, L. Viculis, "Polyfunctional Cubic Silsesquioxanes as Building Blocks for Organic/Inorganic Hybrids," J. Appl. Organometallic Chem. 12, 715-23 (1998).
3. E. K. Lin, C. R. Snyder, F. I. Mopsik, W. E. Wallace, W. L. W. C. X. Zhang, R. M. Laine "Characterization of Epoxy-Functionalized Silsesquioxanes as Potential Underfill Encapsulants," in Organic/Inorganic Hybrid Materials, MRS Symp. Ser. Vol. 519, R. M. Laine, C. Sanchez, C. J. Brinker, E. Giannelis eds. 1998 pp. 15-20.
4. M. C. Gravel, C. Zhang, M. Dinderman, R. M. Laine "Octa(3-chloroammonium-propyl)octasilsesquioxane," J. Appl. Organomet. Chem. 13, 329-36 (1999).
5. R. M. Laine, M. Asuncion, S. Baliat, N. L. Dias Filho, J. Harcup, A. C. Sutorik, L. Viculis, A. F. Yee, C. Zhang, and Q. Zhu, "Organic/Inorganic Molecular Hybrid Materials From Cubic Silsesquioxanes," in Organic/Inorganic Hybrid Materials, MRS Symp. Ser. Vol. 576, L. Klein, M. De Guire, F. Lorraine, J. Mark eds. December 1999 pp. 3-14.
6. C. Zhang, R. M. Laine "Hydrosilylation of allyl alcohol with $[HSiMe_2OSiO1.5]_8$. Octa (3-hydroxypropyldimethylsiloxy)octasilsesquioxane and its octamethacryl-ate derivative as potential precursors to hybrid nanocomposites," J. Am. Chem. Soc. 122, 6979-88 (2000).
7. C. L. Soles, E. K. Lin, W-L. Wu, C. Zhang, and R. M. Laine, "Structural Evolution of Silsesquioxane-based Organic/Inorganic Nanocomposite Networks," in Organic/Inorganic Hybrid Materials—2000, MRS Symp. Ser. Vol. 628, R. M. Laine, C. Sanchez, and C. J. Brinker, eds. Mater. Res. Soc., 2001, CC4.2.1-6.
8. R. M. Laine, J. Choi, I. Lee, "Organic-Inorganic Nanocomposites with Completely Defined Interfacial Interactions," Adv. Mater. 13, 800-3 (2001).
9. R. O. R. Costa, W. L. Vasconcelos, R. Tamaki, and R. M. Laine, "Organic/Inorganic Nanocomposite Star Polymers via Atom Transfer Radical Polymerization of Methyl Methacrylate Using Octafunctional Silsesquioxane Cores," Macromol., 34, 5398-407, (2001).
10. C. Zhang, T. J. Bunning, R. M. Laine, "Synthesis and Characterization of Liquid Crystal-line (LC) Silsesquioxanes," Chem. of Mater.; 13; 3653-62 (2001).
11. J. Choi, J. Harcup, A. F. Yee, Q. Zhu, R. M. Laine, "Organic/inorganic hybrid composites from cubic silsesquioxanes," J. Am. Chem. Soc. 123, 11420-30 (2001).
12. R. Tamaki, Y. Tanaka, M. Z. Asuncion, J. Choi, R. M. Laine, "Octa(aminophenyl)silsesquioxane as a Nanoconstruction Site," J. Am. Chem. Soc. 123, 12416-7 (2001).
13. R. Tamaki, J. Choi, R. M. Laine "A Polyimide Nanocomposite from Octa(aminophenyl)silsesquioxane" Chem. Materials 15, 793-7 (2003)
14. J. Choi, R. Tamaki, S. G. Kim, R. M. Laine, "Organic/Inorganic Imide Nanocomposites from Aminophenylsilsesquioxanes," Chem. Mater. 15 3365-3375 (2003).
15. Jiwon Choi, Albert F. Yee, and Richard M. Laine, "Organic/Inorganic Hybrid Composites from Cubic Silsesquioxanes. Epoxy Resins of Octa(dimethylsiloxyethyl-cyclohexylepoxide)Silsesquioxane," Macromolecules 15, 5666-82 (2003).
16. J. Choi, A. F. Yee, R. M. Laine, "Toughening of cubic silsesquioxane epoxy nanocomposites using core shell rubber particles; a three component hybrid system," Macromol. 37 3267-76 (2004).
17. C. M. Brick, Y. Ouchi, Y. Chujo, R. M. Laine, "Robust Polyaromatic Octasilsesquioxanes from Polybromophenylsilsesquioxanes, $Br_xOPS$, via Suzuki Coupling," Macromol. 38, 4661-5 (2005).
18. C. M. Brick, R. Tamaki, S-G. Kim, M. Asuncion, M. Roll, T. Nemoto, R. M. Laine, Spherical, Polyfunctional Molecules Using Polybromooctaphenylsilsesquioxanes as Nanoconstruction Sites," Macromol. 38, 4655-60 (2005).
19. S. G. Kim, J. Choi, R. Tamaki, R. M. Laine, "Synthesis of amino-containing oligophenyl-silsesquoixanes, Polymer, 46, 4514-4524 (2005).
20. M. Z. Asuncion, I. Hasegawa, J. Kampf, R. M. Laine, "The selective dissolution of rice hull ash to form $[OSiO_{1.5}]_8[R_4N]_8$ (R=Me, $CH_2CH_2OH$) octasilicates.

Basic nanobuilding blocks and possible models of intermediates formed during biosilification processes," Materials Chemistry 15, 2114-21 (2005).
21. R. M. Laine, "Nano-building blocks based on the [OSiO$_{1.5}$]$_8$ silsesquioxanes," J. Mater. Chem., 15, 3725-44 (2005).
22. A. Sellinger, R. Tamaki, R. M. Laine, K. Ueno, H. Tanabe, E. Williams, G. E. Jabbour, "Solution processable nanocomposites based on silsesquioxane cores for use in organic light emitting diodes (OLEDs)," Chem. Comm., 3700-02 (2005).
23. H. Cheng, R. Tamaki, R. M. Laine, F. Babonneau, Y. Chujo, and D. R. Treadwell, "Neutral Alkoxysilanes from Silica," J. Am. Chem. Soc. 122, 10063-72 (2000).
24. "Well-defined nanosized building blocks for organic/inorganic nanocomposites," R. M. Laine, R. Tamaki, J. Choi, WO 02/100867 A1 Dec. 19, 2002.
25. M. D. Stewart, J. T. Wetzel, G. M. Schmid, F. Palmieri, E. Thompson, E. K. Kim, D. Wang, K. Sotodoeh, K. Jen, S. C. Johnson, J. Hao, M. D. Dickey, Y. Nishimura, R. M. Laine, D. J. Resnick, C. G. Willson, Proc. SPIE-Int. Soc. Opt. Eng. 5751, 219 (2005).
26. I. Hasegawa, M. Asuncion, N. Takamura, "Facile Synthesis of the Cubeoctameric Silicate Anion, Si$_8$O$_{20}$$^{8-}$, its dimethylsilyl derivative, Si$_8$O$_{20}$[Si(CH$_3$)$_2$H]$_8$ and certain derivatives therefrom," U.S. Patent Application publication, 2005/0142054, Jun. 30, 2005.
27. S. Sulaiman, C. M. Brick, C. M. De Sana, J. M. Katzenstein, R. M. Laine, R. A. Basheer, "Tailoring the Global Properties of Nanocomposites. Epoxy Resins with Very Low Coefficients of Thermal Expansion," Macromolecules 39 5167-9 (2006).
28. K. Takahashi, S. Sulaiman, J. M. Katzenstein, S. Snoblen, R. M. Laine, "New Aminophenylsilsesquioxanes, Synthesis, Properties and Epoxy Nanocomposites," Australian J. Chem. 59, 564-70 (2006).
29. C. Brick, E. R. Chan, S. C. Glotzer, D. C. Martin, R. M. Laine, "Self-lubricating nano ball bearings," Adv. Mater. 19, 80-2 (2007).
30. M. Z. Asuncion, R. M. Laine, "Silsesquioxane Barrier Materials," Macromolecules, 40 555-62 (2007).
31. N. Takamura, L. Viculis, R. M. Laine "A completely discontinuous organic/inorganic hybrid nanocomposite based on reactions of [HMe$_2$SiOSiO$_{1.5}$]$_8$ with vinylcyclohexene," International Polymer 56, 1378-1391 (2007).
32. M. F. Roll, M. Z. Asuncion, J. Kampf, R. M. Laine, "para-Octaiodophenylsilses-quioxane, [p-IC$_6$H$_4$SiO$_{1.5}$]$_8$, a nearly perfect nanobuilding block," ACS Nano 2, 320-26, (2008).
33. S.-G. Kim, S. Sulaiman, D. Fargier, R. M. Laine, "Simple syntheses of octaphenyloctasilsesquoxane and polyphenylsilsesquioxane. Starting point for aromatic nanocomposites with complete control of physical and chemical properties at nanometer length scales," in Materials Syntheses. A Practical Guide. Eds. U. Schubert, N. Hüsing, R. Laine, Springer-Verlag, Wein 2008, pp. 179-182.
34. R. M. Laine, M. Roll, M. Asuncion, S. Sulaiman, V. Popova, D. Bartz, D. J. Krug, P. H. Mutin; "Perfect and Nearly Perfect Silsesquioxane (SQs) Nanoconstruction Sites and Janus SQs," J. Sol-Gel Sci. Tech. 46, 335-347 (2008).
35. R. M. Laine, D. Bartz, D. J. Krug, V. Popova, M. Z. Asuncion "Bi- and trifunctional silsesquioxanes for novel coating applications," filed June, 2007. PTO filed August 2008.
36. S. Sulaiman, A. Bhaskar, J. Zhang, R. Guda, T. Goodson III, R. M. Laine, "Molecules with perfect cubic symmetry as nanobuilding blocks for 3-D assemblies. Elaboration of octavinylsilsesquioxane. Unusual luminescence shifts may indicate extended conjugation involving the silsesquioxane core." Chem Mater. 20 5563-5573 (2008).
37. M. Z. Asuncion, M. F. Roll, Richard M. Laine, "Octaalkynylsilsesquioxanes, Sea Urchin Molecular connectors for 3-D-Nanostructures," Macromolecules, 41 8047-8052 (2008).

See also, commonly owned co-pending Published U.S. Application Publication No. 20090012317 (Laine et al, published on Jan. 9, 2009), PCT Application Publication No. WO 2009/002660 (filed on Jun. 2, 2008), and PCT Application No. PCT/US2009/052965 (filed on Aug. 6, 2009) all hereby incorporated by reference for all purposes.

The use of silane coating systems to modify the surface characteristics of a material has been the source of attention in the art, with efforts directed at monosilanes and disilanes. For these latter types of silane coating systems, the resulting species typically bonds only once or twice to the surface as illustrated in the following Reaction (1). The one and two bonds to the surface can be easily hydrolyzed off during washing with water or simple detergents or even physically removed by mild abrasion and thus the surface protection or modification is lost.

The use of functional disilanes as suggested by reaction (2) may provide better and harder coatings but the intermediates are sometimes hard to prepare and also, they can dimerize without forming coatings, as discussed by Loy et al. [D. A. Loy, K. J. Shea, "Bridged Polysilsesquioxanes. Highly Porous Hybrid Organic-Inorganic Materials, Chem. Rev., 95, 1431-42 (1995), incorporated by reference herein.

Reaction 1:

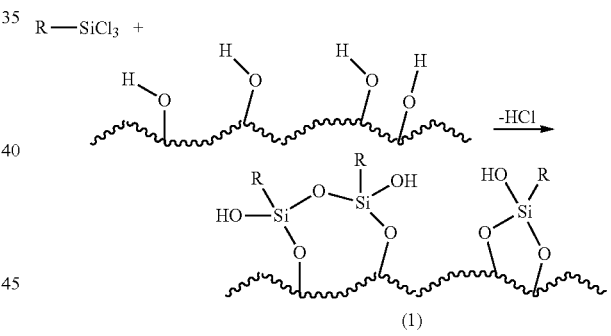

(1)

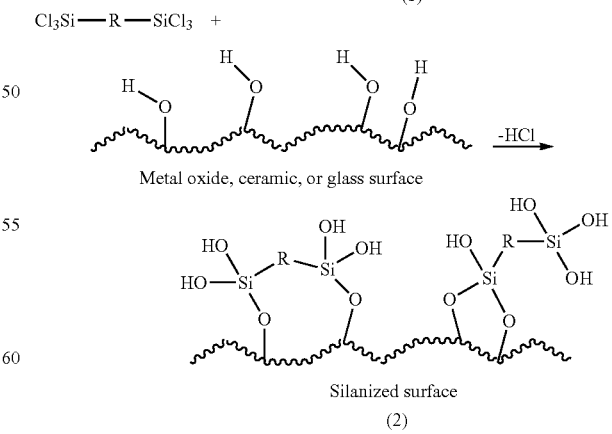

(2)

The literature on hard coatings for protective purposes is quite extensive. There are fields of study on coatings for corrosion resistance, scratch and abrasion resistance, decorative purposes, light absorbing, light transmitting, as low-k dielectric materials, as low friction surfaces, biocidal surfaces, hydrophobic, etc. It is usually recognized that not every coating can satisfy the needs of every application. Further, there is often a trade-off of properties. A coating suitable for one purpose may exhibit some other characteristic making it unsuitable for another purpose. For example, hard coatings that are designed to be scratch resistant are also likely to be brittle. Coatings that are transparent are typically not designed to selectively absorb UV light. Alternately coatings that are transparent are often not transparent to UV light. Coatings that are adherent to metals are not necessarily also adherent to plastic or glass or ceramic or wood. Coatings that are hydrophobic are not necessarily also hard or resistant to deformation or abrasion. It would be attractive to be able to achieve improved balancing of properties to render coatings more useful in multiple applications.

Accordingly, there remains a need in the art for additional materials that can be used as coatings, and particularly hard coatings, in a substrate and that exhibit the ability to form multiple Si—O bonds to surfaces that are strong and difficult to break, and that exhibit an attractive balance of properties.

SUMMARY OF THE INVENTION

In its various aspects the present invention pertains generally to improved materials, and particularly improved SQs that derive additional benefits from the introduction to the SQ of one or more functional additives or other agents to impart a functionality or functional group, to control crosslinking of the SQs, or both. The materials are particularly useful as coatings due, at least in part, to structures and properties that can be realized through the use of the teachings herein. By way of illustration, one aspect of the invention contemplates a method of forming a coating comprising the steps of dissolving an SQ (e.g., one that is primarily a cage compound with 8, 10, 12, 14 or related complete cages or with partially condensed cages containing primarily $Si(O)_4$ units in the cage) in a solvent (e.g., selected from an ether, a ketone, an ester (e.g., one having a relatively low boiling point, such as below about 80° C.), acetonitrile, an alcohol or any combination thereof) to form an SQ solution; introducing (e.g., dissolving) an additive in the solution (e.g., the additive being selected from a rare earth compound, an acid, an organic moiety, a precious metal or compound thereof, a transition metal compound, or any combination thereof, or any of their ionic constituents); and optionally mixing a diluent with the solution to form a coating that is applied to a substrate, wherein the resulting coating forms crosslinks between resulting pendant $Si(OH)_x$ groups and a substrate surface. The present invention also contemplates coatings and coated articles consistent with the present teachings.

The coatings of the invention offer attractive balancing of properties heretofore not achievable using many conventional silane hard coatings. For example, hard coatings herein may exhibit a combination of two, three, four or more performance characteristics such as relatively good scratch resistance, relatively high toughness, a relatively good balance of transparency and absorbtion of UV light, relatively good adhesion to a plurality of multiple different substrates (e.g., to plastic or glass or ceramic or wood), or relatively good hydrophobicity. These characteristics are due at least in part to the unexpected results obtained by the processing herein with the functional additives or other agents to impart a functionality or functional group, to control crosslinking of the SQs, or both.

Among the many unexpected results achievable using the present teachings are the fact that the coatings are relatively tough, resistant to scratching, stable to temperatures in excess of 400° C., they provide a substantially permanent or at least semipermanent mold release for applications such as nanoimprint lithography, mold tooling (e.g., for metal, polymer or ceramic molds), they afford very high resolution of features (especially attractive in tooling and/or lithography applications) with the possibility of feature sizes on the order of below about 50 nm (e.g., about 20 nm); they can be used as a relatively low stick surface coating on other tools as well (e.g., cooking utensils). The present teachings thus contemplate processes that use the coatings herein in one or more of the above applications.

DETAILED DESCRIPTION

Figure 1:
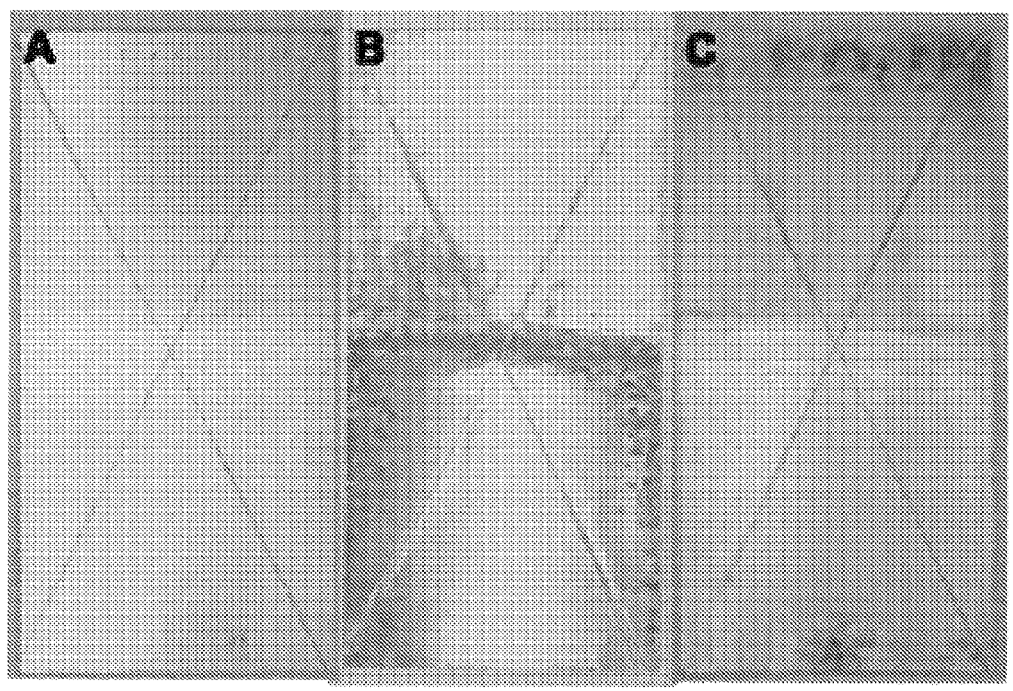
FIG. 1A is an illustrative micrograph of a panel expected after corrosion testing of a panel having a coating that includes about 4 wt. % OTSE and about 0.5 wt. % Ce propionate.
FIG. 1B is an illustrative micrograph of a panel expected after corrosion testing of a panel having a coating that includes about 4 wt. % OTSE with no inhibitor.
FIG. 1C is an illustrative micrograph of a panel expected after corrosion testing of a panel having a coating that includes about 4 wt. % OTSE and about 0.5 wt. % Zr propionate.

As used herein, "OTSE" shall refer to octa(triethoxysilyl-ethyl methylsiloxy)silsesquioxane. "TTSE" shall refer to (tetratriethoxysilylethyldimethyl siloxy)(tetrahydridodimethylsiloxy)octasilsesquioxane. "TCTSE" shall refer to tetra-cyclohexenyltetratriethoxysilylethylsilsesquioxane. "TOETSE" shall refer to (Tetraoxyethanolethyldimethylsiloxyl)tetratriethoxysilylethylsilsesquioxa-ne. "TGTSE" shall refer to (tetratriethoxysilylethyldimethylsiloxy)(tetraglycidyldimethylsiloxy)octasilsesquioxane. "TCPTSE" shall refer to (tetratriethoxysilylethyldimethylsiloxy) (tetra-3-chloropropyl-dimethylsiloxy)octasilsesquioxane. "OCPSE" shall refer to octa-3-chloropropyl-dimethylsiloxy)octasilsesquioxane. As used herein, Et shall refer to an ethyl group, Me shall refer to a methyl group, and prop shall refer to propionate.

As gleaned from the above, it is thus seen that the present invention pertains to novel multifunctional silsesquioxane (SQ) structures and their use in making hard coatings with internal or external structuration and with tailorable properties. In one general aspect, the invention makes use of hitherto unknown bi and trifunctional silsesquioxanes (SQs), wherein the functional groups are added (e.g., more or less statistically driven) by both attractive and repulsive forces between the reactive groups themselves on and off the SQ, by any catalyst, or a combination thereof.

The present invention makes advantageous use of reactions for forming silsesquioxanes, and particularly silsesquioxanes that offer di- to octa-functionality at some or all of its corners. It also makes use of the ability to mask certain moieties, such as $Si(OH)_3$ moieties, preferably through the use of two or more other moieties, such as $Si(OEt)_3$, $SiMe(OEt)_2$, $MeSiCl_2$ and/or $SiCl_3$ masked $Si(OH)_3$ moieties (where Me is methyl). In this regard, the present invention contemplates the selection of certain moieties for masking that will locate themselves at corners of silsesquioxanes, and help to enhance the formation of multiple Si—O bonds to surfaces of a substrate, which are strong and difficult to break.

Preferably, the resulting structures obtained generally will be such that one functionality on the resulting SQ will have $Si(OH)_{2/3}$ groups masked in the form of $alkyl_{2/1}Si(OR)_{2/3}$ or $alkyl_{2/1}SiCl_{2/3}$ where the alkyl group(s) binds the masked $Si(OH)_{2/3}$ groups to the SQ structure. The other functionality can be either the same types of masked groups or a second type of group designed to add or subtract properties from coatings or thin films made therefrom.

As will be seen from the reactions illustrated herein it is also possible that the teachings herein will produce a structure that includes an SQ coating on a substrate, bonded by way of at least one, and preferably two oxygen atoms attached to a silicon that is part of the SQ structure. In this regard, without intending to be bound by theory, the structures herein may make it possible to locate moieties other than mere —OH generally in surrounding relationship relative to the oxygens bonded to a substrate surface, and may thus help serve a protective function. This is believed to provide additional protection to the Si—O bonds to surfaces of the substrate. The depictions of Schemes 3-5 help to illustrate.

As can be seen, a number of advantages are made possible by this type of structure and the teachings herein. For example, one advantage is that these same masked moieties can also form extensive crosslinked networks between these groups and between cages on a surface. That is, they can now form silica networks modified by organic groups as illustrated in Scheme 1. SQ coatings based on compounds such as illustrated in Scheme 1 which is not meant to be limiting seem to provide the opportunity to formulate coating mixtures and produce novel coatings therefrom that are not obvious to one of average skill and that offer properties useful across multiple applications something not anticipated in the art.

In particular, the invention makes use of a step of hydrosilylation to introduce desired functionalities at the corners of the molecule. By way of example, the following Scheme 1 illustrates a reaction sequence that involves a step of hydrosilylation of an SQ (e.g., tetradimethylsiloxy)octasilsesquioxane (TTSE)) with a suitable monomer or other moiety (e.g., a vinyl). As seen, for Scheme 1, the vinyl may include one or any combination of the following R functionalities:

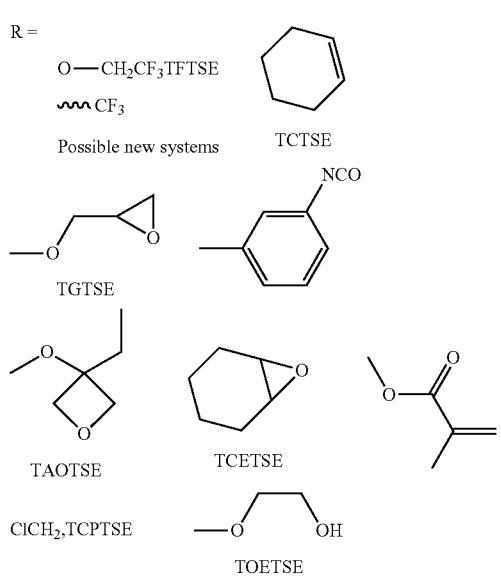

As seen, the reaction may be conducted in the presence of a suitable catalyst (e.g., one that includes platinum). SQs in which the vinyltriethoxy groups of the TTSE are replaced using a vinyl or allyl diethoxyphosphonate may be used in place of TTSE for any of the reactions described herein. For example the vinyltriethoxy groups may be replaced with a $(EtO)_2P(=O)CH_2CH_2$, to form a SQ having the formula $(HSiMe_2OSiO_{1.5})_4((EtO)_2P(=O)CH_2CH_2SiMe_2OSiO_{1.5})_4$. This example is meant only for illustrative purposes and one of average skill in the art will recoognize that other possible moieties can be added to promote adhesion to specific surfaces for example isocyanates, anhydrides, acyl chlorides, could also be used as long as the functional groups on the opposing sides were compatible.

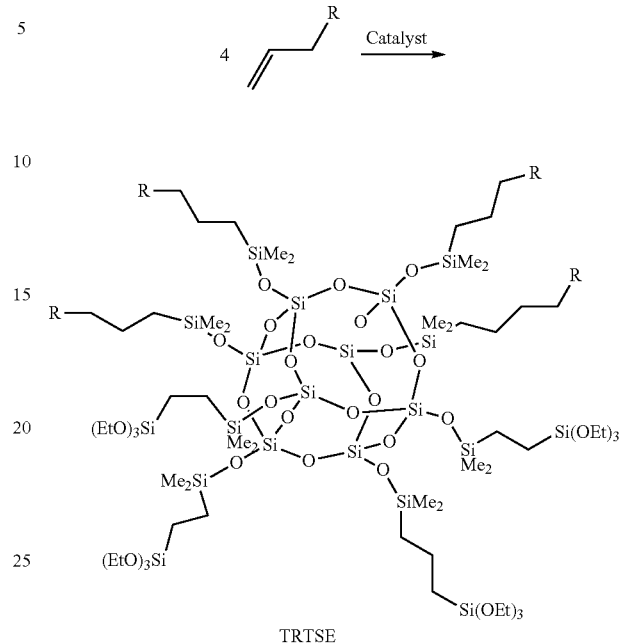

Reaction 3 illustrates another example of silsesquioxanes that are the subject of this invention that offer tetra to octafunctionality at each corner. As can be seen, if an SQ (e.g. octa(dimethylsilyloxy)silsesquioxane (OHS)) of reaction (3) is reacted with more than four $CH_2=CH—Si(OR)_3$ equivalents (e.g., where R may be a suitable functionality, such as Et), it may be possible to put on as many of these groups as desired, such as up to eight masked groups (e.g., $Si(OR)_3$ groups.

Reaction 3:
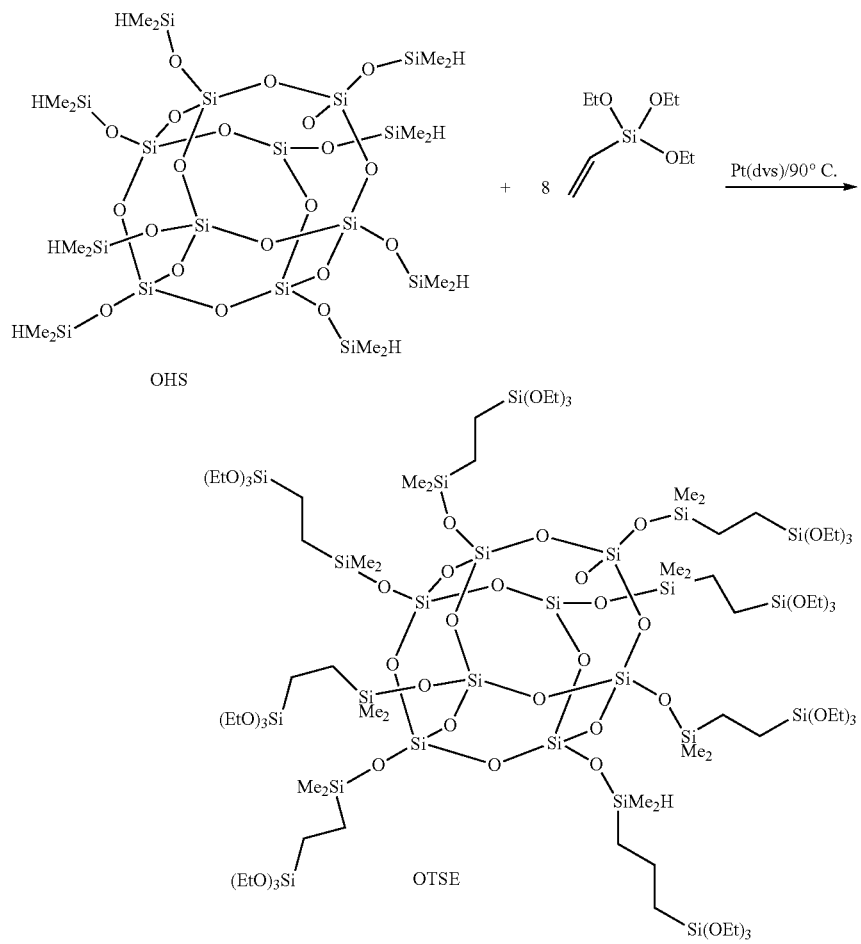
The following Reaction 4 illustrates an example of how masked groups can be unmasked. By way of illustration, it is seen that acidic water can be used to unmask ethoxy groups.
Reaction 4:
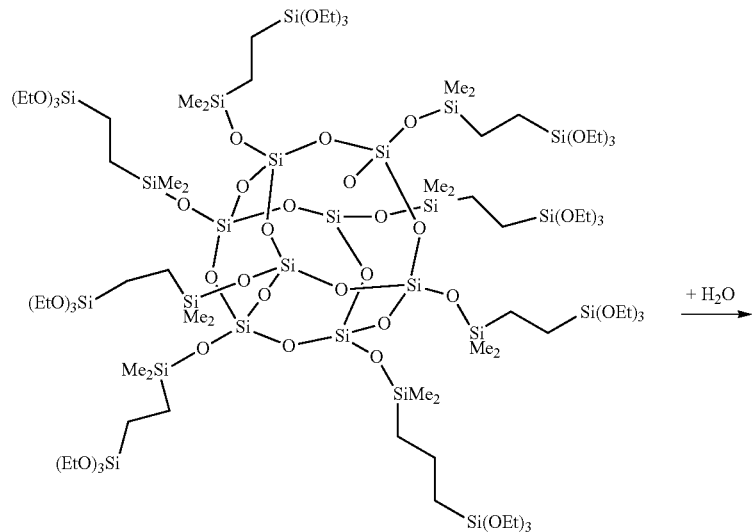

-continued

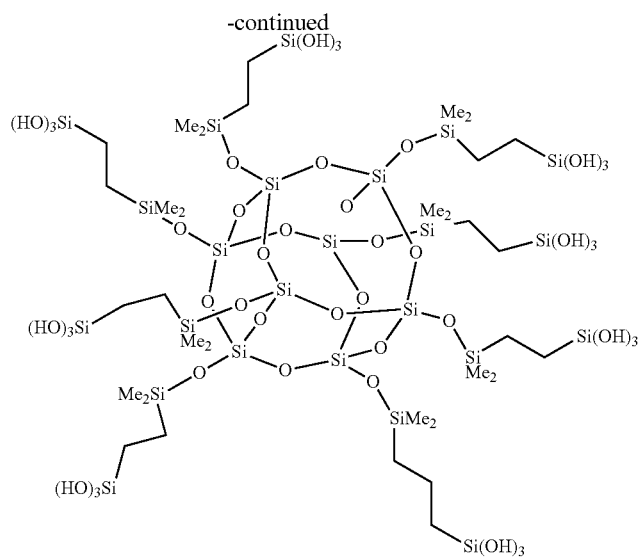

The present invention also contemplates the employment of masking (or unmasking) in order to specifically tailor properties of an SQ. For example, the invention contemplates introducing one or more inorganic ion (e.g., a rare earth metal ion, a transition metal ion, or a combination thereof) into the SQ. The matrix of the SQ is such that it can at least partially immobilize any such inorganic ions. For example, rare earth metal ions can be introduced to take advantage of their responses to UV or IR light making them act as phosphors. These same rare earth metal ions can also act to promote corrosion resistance when coated on certain types of metal substrates. Scheme 3 illustrates.

Scheme 2: Crosslinking of SQ (e.g., OTSE) on hydrolysis

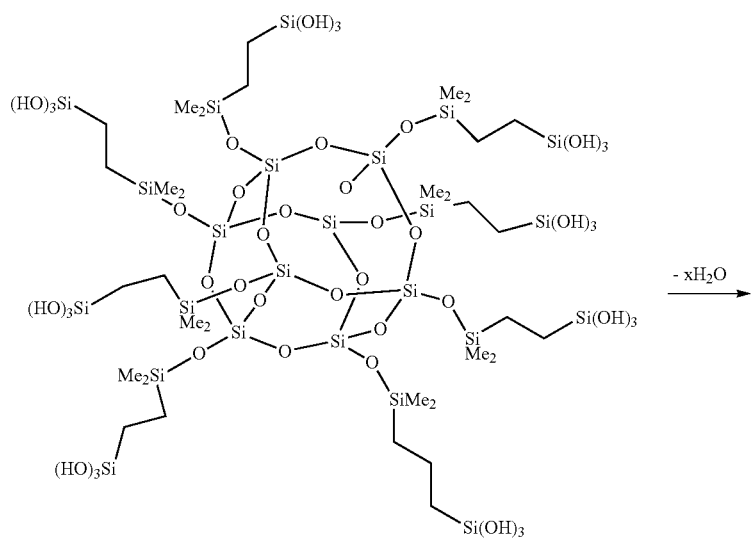

$-xH_2O$

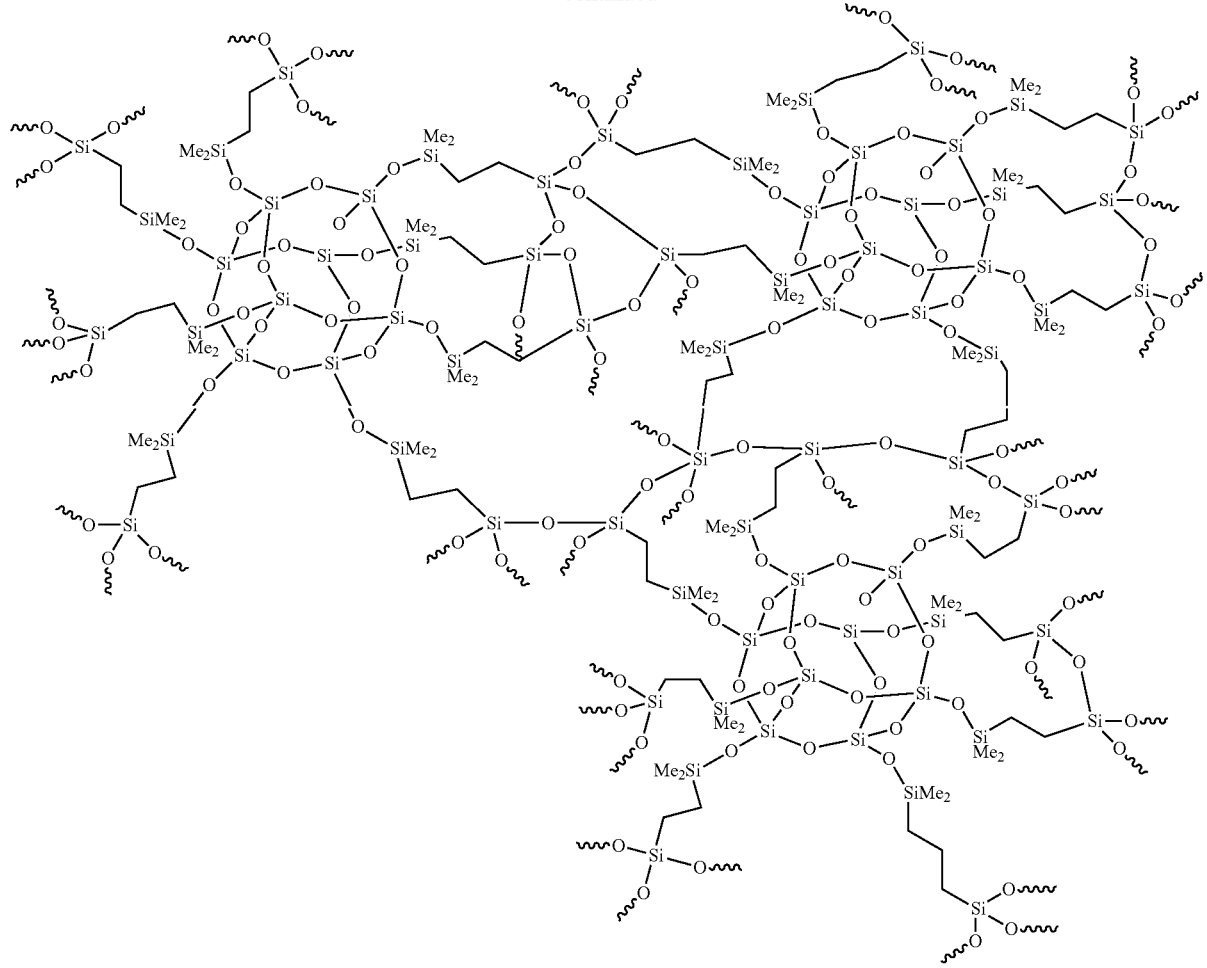

It may be possible to use compounds such as illustrated in Scheme 1 to modify the organic content of the coatings as illustrated in Scheme 5. These organic moieties can be used for a variety of purposes that include modifying the mechanical properties of these coatings, modifying their ability to interact with light or heat by decomposing to form pores or polymerizing to form interpenetrating inorganic-polymer networks. These organic moieties may be subject to coloration of the coating, and/or they may receive decorative or other types of patterning including nanoimprint patterning also called nanoimprint lithography.

Scheme 3: Introduction of rare ions into crosslinked matrix

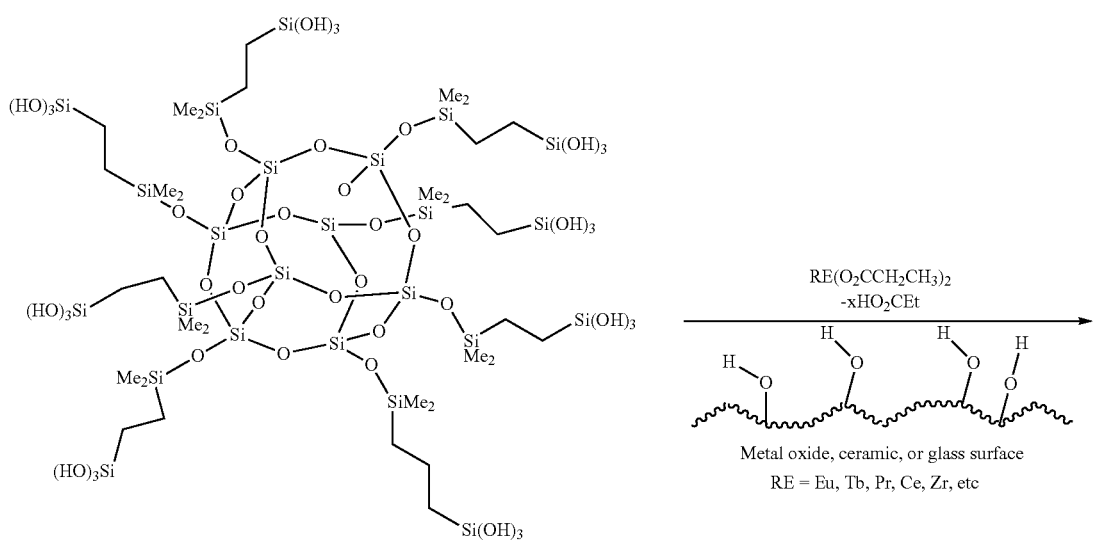

-continued

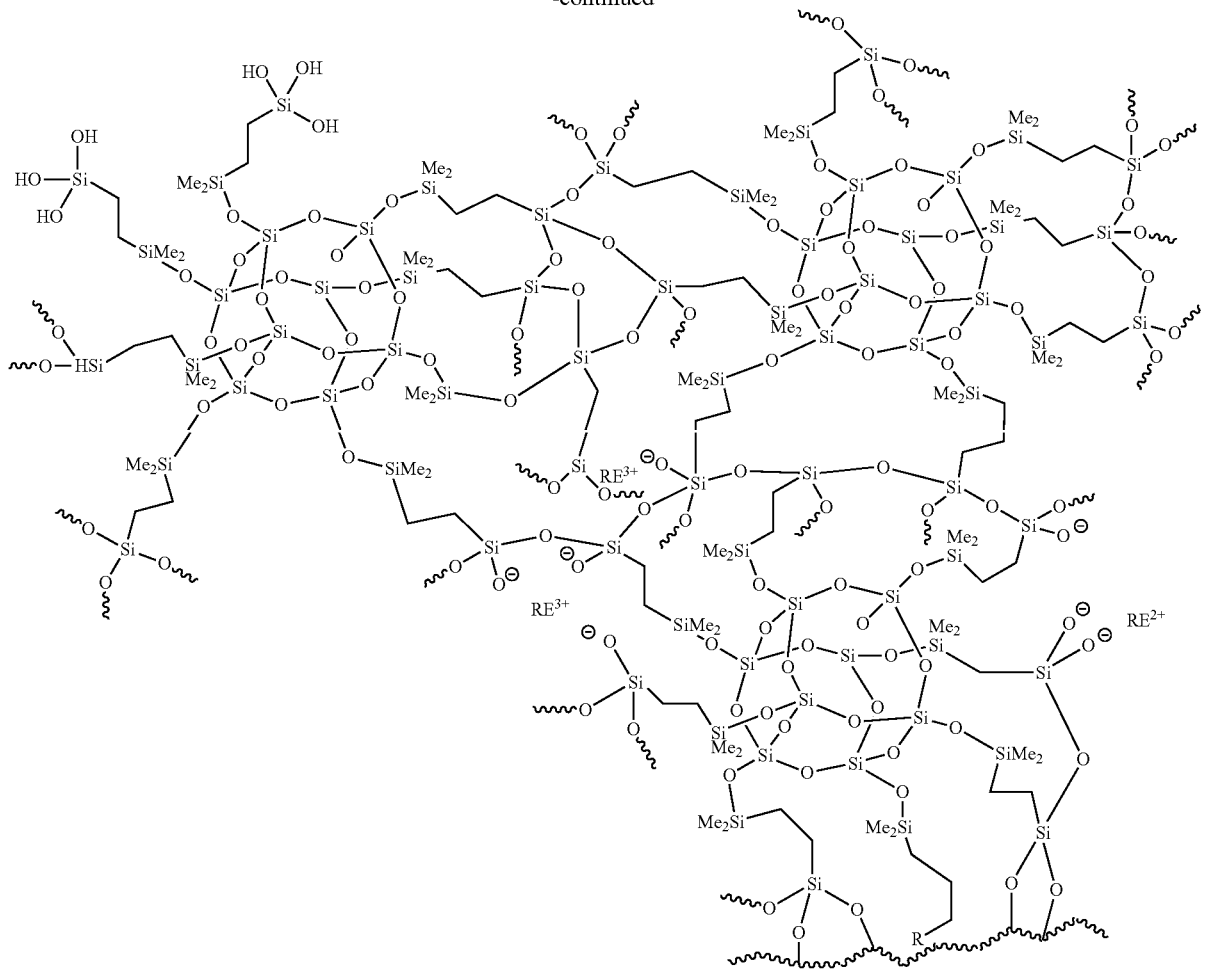

One can also introduce transition metal ions for the same purposes, or in the case of silver, copper, zinc and gold, to introduce forms of biocidal activity (e.g., bactericidal) behavior into the coatings or onto their surfaces as suggested by Scheme 4 (below) which is not meant to be limiting. Examples of ions and their use as biocides are shown in W. J. Degoli SILVER ION BACTERICIDAL COMPOSITION, U.S. Pat. No. 3,035,968 March 1962; and Andrew B. Arata, Disinfectant and Method of Making US 2005/0274624, both incorporated by referenced.

Other variations are also possible. For example, as seen with Schemes 2 and 3, it may be valuable to use an SQ (e.g., TTSE as shown in Scheme 1) as a reducing additive to reduce the metal ions to lower oxidation states or even colloidal forms to take advantage of their activity and/or coloration to change the transparency, catalytic or bactericidal activites. The SQ (e.g., TTSE) may also form stronger bonds to the metals in the reduced state limiting the rate at which they are leached out for example for control of corrosion resistance behavior. It may also be possible to crosslink a plurality of SQ molecules, such as in hydrolysis.

Scheme 4: Introduction of other metals into a crosslinked matrix
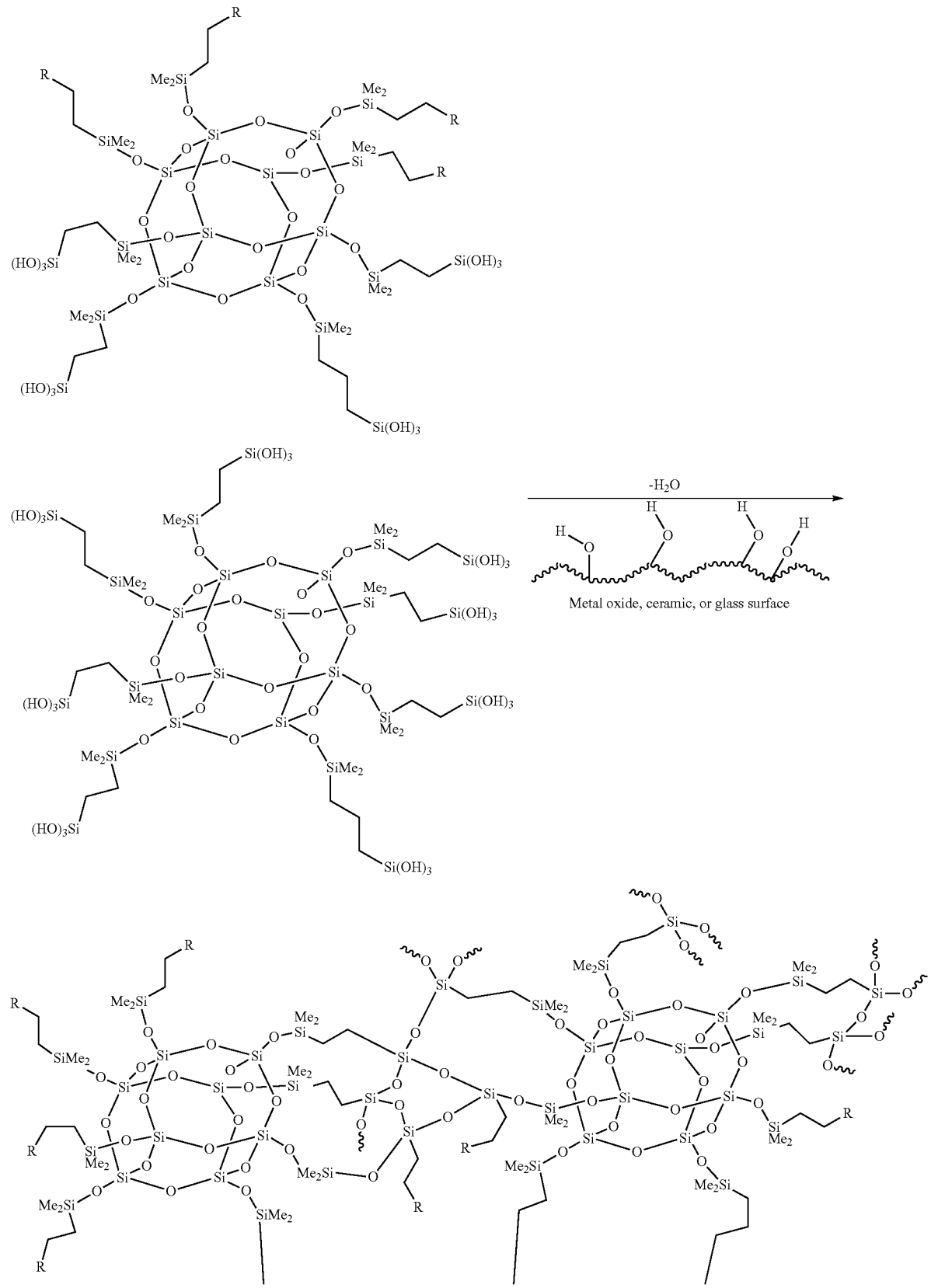

-continued
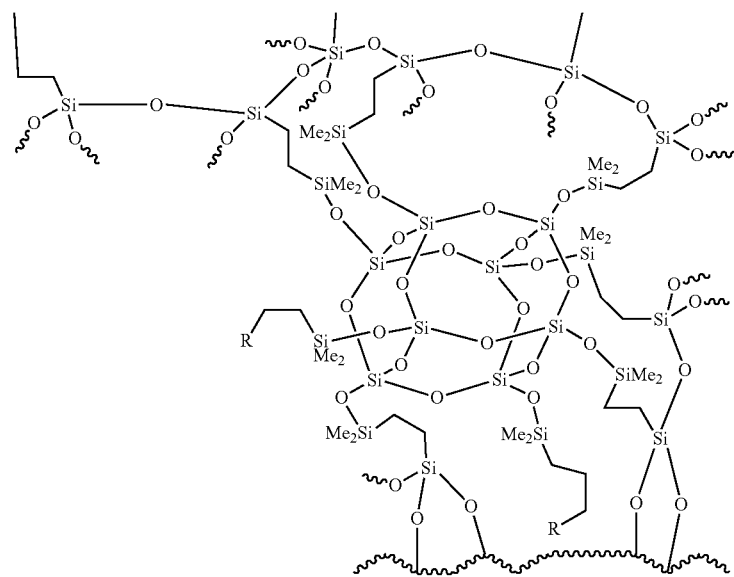
Scheme 5: Introduction of other organics into a crosslinked matrix
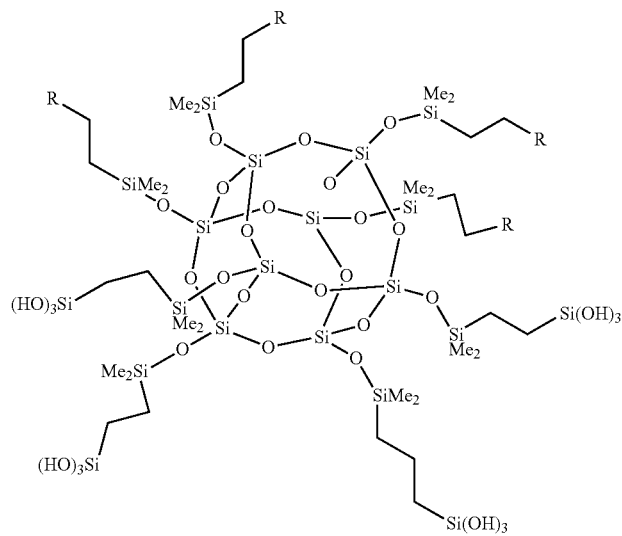

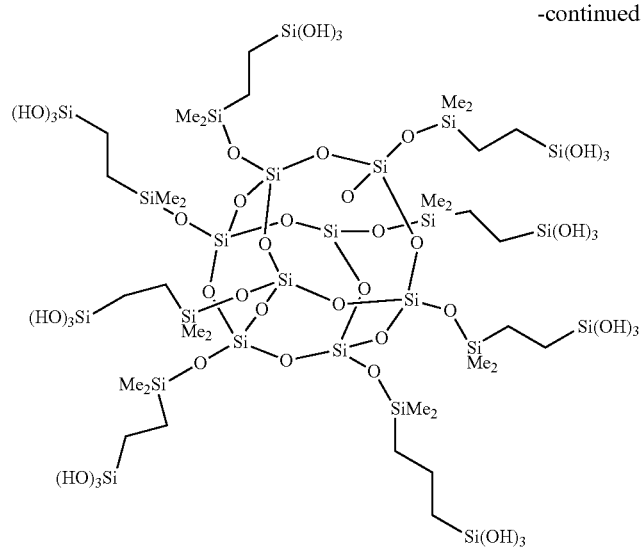

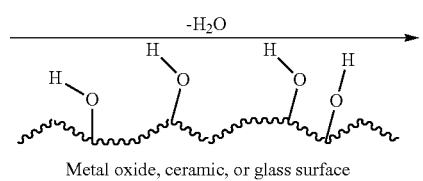

Metal oxide, ceramic, or glass surface

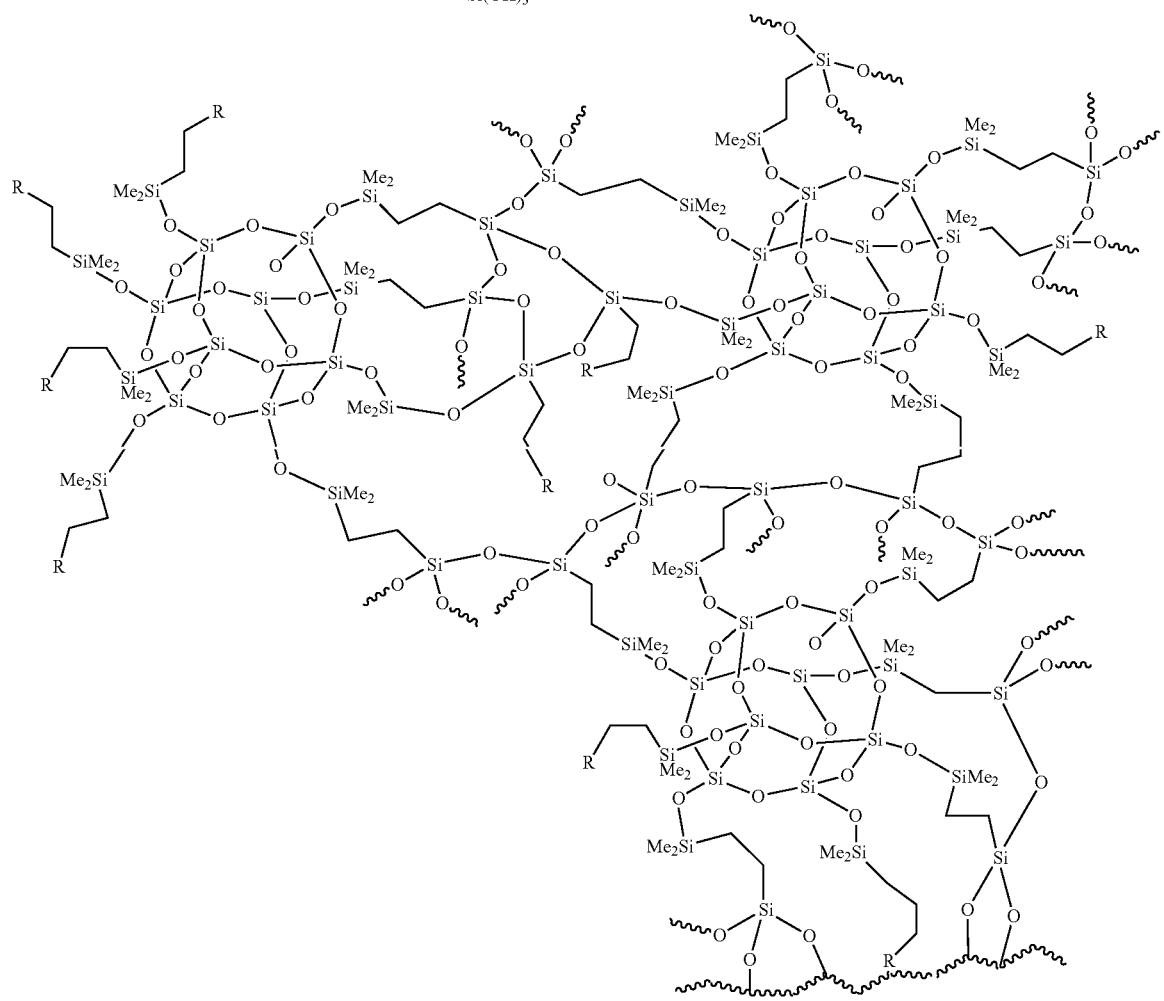

In a general aspect of the invention, there is contemplated a method by which a coating composition is made that includes the steps of: dissolving a silsesquioxane (SQ) in a solvent to form an SQ solution; introducing an additive into the solution (e.g., an additive selected from a rare earth metal containing compound, a transition metal containing compound, an organic moetiy, an acid, or any combination thereof) in a sufficient amount to impart a predetermined function to the desired resulting coating; and optionally mixing a diluent with the solution to form a coating that is applied to a substrate. The process may include one or more steps of heating. The process may include one or more steps of stirring (e.g., from about 5 minutes to about 5 or even 10 h; longer or shorter times are also possible).

In a more particular aspect, as can be appreciated from the above teachings, advantageous results may be obtained by the preparation of a material in which a silsesquioxane (SQ) comprised of one or more silsesquioxane oligomers to which are covalently bonded three or more alkyldialkoxy-, alkyltrialkoxy-, alkyldichloro- or alkyltrichloro-silane moieties is dissolved in a suitable solvent. To this solution may be added compounds or materials either soluble or insoluble designed to aid in wetting, corrosion resistance, coloring or to add absorptive or decorative behavior, or add antiviral, antibacterial or other biocidal activity behavior, to introduce surface roughness or any combination thereof. Thereafter, water at a controlled pH may be added to generate multiple, pendant alkylSi(OH)$_x$. The solution optionally may be aged to create some degree of crosslinking between these groups and the introduced compounds (e.g., their ions) and/or insoluble components. It may be done at, below or above about room temperature or at an elevated temperature (e.g., as low as about 0° C., about 23° C., or above about 100° C.).

The resulting mixture may be applied to a substrate using standard methods (spin casting, dip coating, doctor blade coating, spray coating or brush coating) to a surface that may be cooled or heated to modest temperatures. The coating may be allowed to dry and cure either at ambient temperature or through heating (e.g., above about 100° C., above about 250° C., or even up to about 400° C.) to form crosslinks between the pendant Si(OH)$_x$ groups and the surface and with each other creating a unique thermally stable and oxidation resistant material with tailored decorative, patterned, mechanical, photonic, electronic and/or dielectric properties or controlled reactivity to etchant gases.

As indicated, it may be possible to use compounds such as illustrated in Scheme 1 to modify the organic content of the coatings as illustrated in Scheme 5. These organic moieties can be used for a variety of purposes that include modifying the mechanical properties of these coatings, modifying their ability to interact with light or heat by decomposing to form pores or polymerizing to form interpenetrating inorganic-polymer networks. These organic moieties may be subject to coloration of the coating, and/or they may receive decorative or other types of patterning including nanoimprint patterning also called nanoimprint lithography.

For example, procedures for preparing thin films and patterned films using nanoimprint lithography (NIL) may be as follows. First, to a stirred solvent (e.g., tetrahydrofuran (THF, 6 mL) in a 50 mL round bottom flask), one or more SQs (0.1 to 10.0 mmol) may be added, preferably being followed by adding (e.g., dropwise) a mixture of distilled water (H$_2$O) and acid (e.g., hydrochloric acid (HCl, 1 M)) while stirring (e.g., at about 0° C.). The molar ratio of the reaction mixture may be about 1:0.2:50 [SQs:acid (e.g., HCl):H$_2$O]. After stirring the reaction mixture (e.g., for about 0.2-10 h) at about room temperature, the reaction mixture is poured into a solvent system consisting of ethers or ketones and ethers and water, resulting in a phase separation. The organic phase is recovered and stirred with a suitable drying agent (e.g., magnesium sulfate (MgSO$_4$)) for a sufficient period of time (such as about 30 minutes (min)) followed by filtering (e.g., through 0.4 um PTFE syringe filter). Solvent is slowly evaporated by a rotary evaporator. The remaining product may be diluted and used to form thin films on a substrate. For example, films having a thickness of about 100 to about 500 nm (e.g., about 300 nm thick) may be made by coating (e.g., by spin coating) under suitable conditions. For example, SQ films may be prepared from solution by spin coating onto a cleaned substrate (e.g., a Si or quartz wafer) at about 1000 to about 2000 rpm (e.g., about 1500 rpm) for a sufficient amount of time (e.g., possibly even less than about 2 minutes, e.g., about 20 sec). The applied films may be subjected to a conformal contact with a suitable tool (e.g., an SiO$_2$ mold in an imprint machine (NX-2000, Nanonex Inc.)) for a suitable time and temperature to form a permanent pattern in the coating. This may be done under evacuated conditions. To illustrate, after evacuating a sample chamber for a sufficient time (e.g., about 2 min), the imprints may be made in two steps: 1-60 s at 100° C. and 0.1 to 5 MPa followed by 1-20 min at 170° C. and 0.1 to 10 MPa. The imprint tool may then be cooled to between 0 and 100° C. before releasing the pressure and separating the pattern from the mold. The SQ imprints may be further vitrified, such as by heating to one or more temperatures of about 250-440° C. (optionally under a substantially inert environment, such as N$_2$) environment for a suitable period (e.g., a period of about 0.1 to 3.0 h), optionally with ramp rates of about 1-10° C./min.

The SQs of the present invention may be primarily cage compounds with 8, 10, 12, 14 or related complete cages or with partially condensed cages containing primarily Si(O)$_4$ units in the cage.

The coating systems of the invention may include additives that are single and/or mixed rare earth oxide nanopowders, or chemical compounds, or any combination thereof. The coating systems may be such that the resulting coating offers improved hardness and/or abrasion resistance coupled with the emissive properties of the rare earth ions and the potential to passivate metal substrates towards corrosion including but not limited to aluminum, magnesium, or steel alloys. The coating systems of the invention may include additives that are single and/or mixed transition metal nanopowders, precious metal oxide nanopowders, any combination thereof, as well as any chemical compounds of such materials, such that the resulting coating offers improved hardness and/or abrasion resistance coupled with the bactericidal properties of the metal ions and the potential to provide hydrophobic coatings on substrates including but not limited to metal, glass, ceramic, plastic or wood surfaces.

Mixtures of compounds, such as Janus and OTSE compounds, may be combined to produce hard, hydrophobic coatings on various metal, ceramic or polymer substrates such that these coatings resist buildup of metal or organic materials impacted on the coated surface.

Mixtures of compounds, such as Janus and OTSE SQs, may be combined to produce hard, hydrophobic coatings with controlled porosity for low k-dielectrics, porous membranes, antireflective coatings, with improved hardness allowing them to be polished to high surface flatness for use but not limiting as interlayer dielectrics, planarization coatings or as substrates for metal vapor deposition or for patterning and controlled resistance to reactive ion etching.

Mixtures of compounds, such as Janus and OTSE SQs, may be combined to replicate multiple copies of a nanoimprint lithography master mold. Owing to their high temperature resistance, low surface energy, high modulus, and ability to replicate features as small as 10 nm or more, these low cost replicated copies can be used directly as nanoimprint lithography molds for either high temperature nanoimprint lithography, where molten material flows into the mold cavity under pressure, or UV nanoimprint lithography, where UV light passes through the mold and induces a cross-linking reaction in a liquid resist material. The low surface energy of these materials circumvents the current industry process of applying a low energy surface coating (such as a chlorosilane-based self assembled monolayer) to the mold to facilitate pattern release.

Mixtures of compounds, such as Janus and OTSE SQs, may be combined to produce hard, hydrophobic coatings that are icephobic. Mixtures of compounds, such as Janus and OTSE SQs, may be combined to produce hard, hydrophobic coatings that contain quantities of colloidal silver and/or copper to provide abrasion resistant surfaces that are bactericidal. Mixtures of compounds, such as Janus and OTSE SQs, may be combined to produce hard, hydrophobic coatings on various metal, ceramic or glass substrates such that these coatings resist buildup of organic materials derived from cooking various foods on substrates coated with these materials. Mixtures of compounds, such as Janus and OTSE SQs, may be combined to produce hard, hydrophobic coatings with controlled resistance to reactive ion etching to produce patterned substrates.

Additives herein selected from a rare earth compound, an acid, an organic moiety, a precious metal or compound thereof, a transition metal compound, or any combination thereof, contemplate the compounds and/or their ionic components.

Additional benefits and advantages are also possible. For example, functionality can be varied at nanometer length scales with regard to mechanical and thermal properties, conductivity (electronic, ionic or thermal), biological interactions, light prop-agation IR, visible, UV, mirror), other electromagnetic phenomena, or any combination thereof. The films can be prepared at room temperature or heated to a variety of temperatures including those that may degrade some parts of the functionality but not others. One can also make multilayer coatings using the same technologies. References to "layers" or "multi-layers" herein generally refer to a location in which the properties or characteristics of the molecule are substantially similar or even generally homogeneous. Multilayer structures can thus refer to a single molecular structure that has relatively controlled or consistent variation of properties or characteristics within the structure. Such structures may be possible from molecular synthesis. It also can refer to structures resulting from the assembly of plural discrete layers in separate steps (e.g., separate coating steps). In one aspect, it is also possible that the layers herein effectively are the layers that would result from a core-shell type of structure. Thus, layers or multi-layers is not intended to be limited to only planar arrangements of the structures. Examples of multi-layer structures and how to prepare them are illustrated without limitation in commonly owned co-pending Published U.S. Application No. 20090012317 (Laine et al) and PCT application No. WO 2009/002660, incorporated by reference for all purposes. The present invention may also be employed for SQ resins (e.g., SQ epoxy resins, such as octa[(3-propylglycidylether)dimethylsiloxy] octasilsesquioxane and octa[1,2-epoxy-4-ethylcyclohexenyl)dimethylsilyloxy)]octasilsesquioxane).

In brief, it can be seen that the present invention allows for the formation of various improved materials, and coatings, that offer, among other attributes at least one, or any combination of the following properties or characteristics:

1) thermal expansion coefficients (CTEs) tailored from 20 to >250 ppm/° C.;
2) $O_2$ barrier properties equal to commercial materials but with >100° C. higher stability;
3) low, room temperature viscosities (<1000 MPa-s, measured on the neat);
4) potential to be applied with minimal or no solvents to surfaces;
5) good adhesion to glass, carbon, ceramic, metal and some plastic surfaces;
6) superior resistance to moisture uptake and degradation (e.g., less than 1 wt %, preferably less than 0.5 wt % uptake after 7 d immersion);
7) resistance to hydraulic fluids, jet fuel and other organic solutions (e.g. volume swelling of less than about 50%, preferably less than about 30%);
8) one or any combination of mechanical properties such as high strength (e.g. high elastic modulus, E=2.4 GPa or higher), high fracture toughness ($K_{1C}$=-1.8 MPa/m or tougher), pencil hardness ($\geqq$4H), high glass transition temperature (e.g. Tg$\geqq$200° C.);
9) transparent to UV radiation;
10) hydrophobicity;
11) weatherability;
12) high temperature lubricant characteristics;
13) control of refractive index; or
14) control of dielectric constants.

EXAMPLES

Amounts, compositions, and processing parameters set forth in the following examples are for illustration purposes and are not intended to limit the invention. Amounts may vary (e.g., ±about 10%, or even about 25%) from those shown and similar results are expected. Further, similar results are contemplated for other SQs (e.g., OTSE, TCTSE, TOETSE, TCPTSE, OCPSE, or otherwise) than those shown. Processing parameters likewise may vary (e.g., ±about 10%, or even about 25%) from those shown and similar results are expected. Though certain additives are identified in the examples, others may be employed as described generally in the foregoing.

Examples of Corrosion Resistant, Optical Quality, Hard Coatings

A solution of SQ (e.g., in an amount of at least about 0.2 g (0.08 mmol), 0.4 g (0.16 mmol), 0.8 g (0.32 mmol)) is prepared in a solvent (e.g., 0-100% alcohol and 100-0% ketone). An additive is dissolved in the solution (e.g., an additive selected from a rare earth metal containing compound). A diluent (e.g., water) may then be mixed (such as by stirring for about 5 to about 300 minutes) with the solution to form a coating. The resulting coating may then be applied to a substrate, and optionally heated (e.g., to about 100-400° C.) for a sufficient period to dry the coating (e.g., about 24 h).

General:

The standard procedure for preparing corrosion resistant coatings is as follows. First, 0.2 g (0.08 mmol), 0.4 g (0.16 mmol), 0.8 g (0.32 mmol), or a larger amount of SQ material in 12.5 ml of solvent consisting of 0-100% alcohol and 100-0% ketone to make 2, 4, 8 wt %, or high loading SQ solutions. Then, either 0.01-0.10 g (0.01-0.2 mmol) of rare earth propionate, $M(O_2CCH_2CH_3)_3(OH)$, or $M(O_2CCH_2CH_3)_2(OH)_2$, [M=Ce, Zr, Pr, Eu] is added as a corrosion inhibitor to two batches of 2 and 4 wt % OTSE. After both the SQ material and the corrosion inhibitor are dissolved, 0.1-10.0 ml in 100 ml-water solution is added and allowed to stir for 5-300 minutes. Thereafter, the coating can be spray or dip coated onto steels, aluminum, magnesium, cloth, or glass. Samples can then be cured at room temperature for 24 h or heated to 100-400° C. to expedite the process.

Example 1

Corrosion tests are performed according to the following parameters. Substrates are scored from corner to corner in an "X". Samples were then placed in a 5% salt-water bath that contained an aeration system to introduce air to the system. The test duration is 200 h It is determined that these parameters are similar to the ASTM 8117 standard salt spray corrosion test through duplicate trial comparison. FIG. 1 shows the expected corrosion test results showing the increase in corrosion resistance by adding either corrosion inhibitor to OTSE coating systems. These coatings are also expected to be able to be bent 90° without exhibiting cracking. FIGS. 1A, 1B, and 1C are micrographs illustrating the corrosion test results for coating system OTSE with and without rare earth corrosion inhibitor additives. FIG. 1A illustrates a coating system with 4 wt % OTSE with 0.5 wt % Ce prop. FIG. 1B illustrates a coating system with 4 wt % OTSE without inhibitor. FIG. 1C illustrates a coating system with 4 wt % OTSE with 0.5 wt % Zr prop.

Example 2

Figure 2:
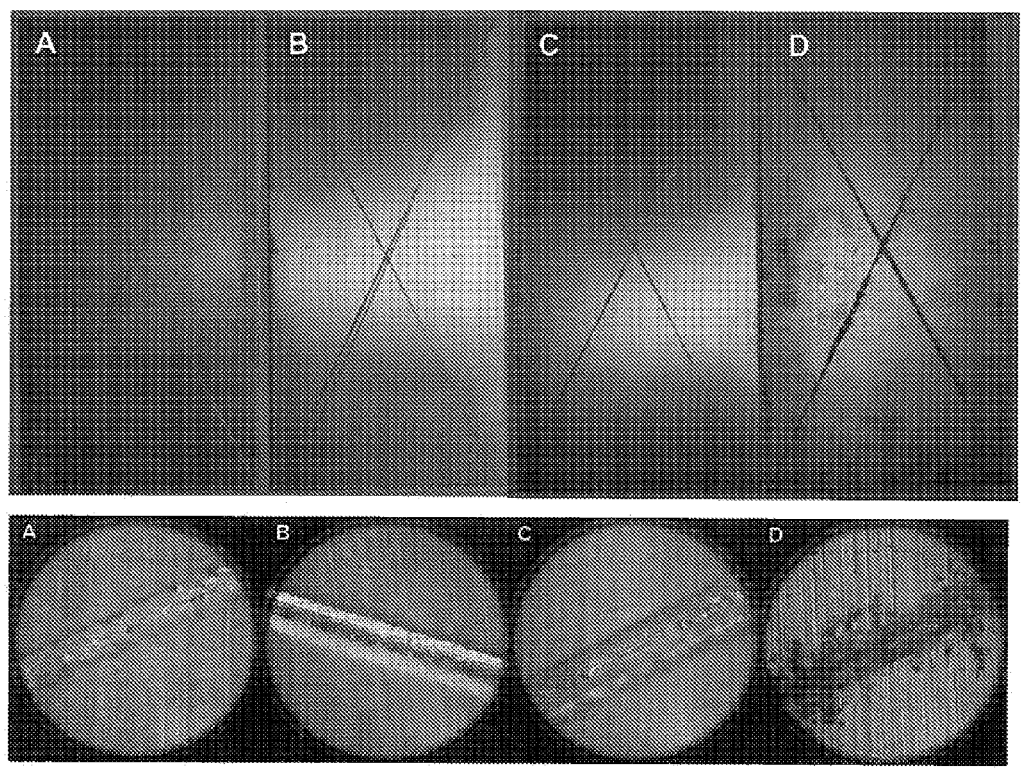
FIG. 2A is an illustrative micrograph of a panel expected after corrosion testing of a panel having a coating that includes about 2 wt. % OTSE and about 0.5 wt. % Ce propionate.
FIG. 2B is an illustrative micrograph of a panel expected after corrosion testing of a panel having a coating that includes about 4 wt. % OTSE and about 0.5 wt. % Ce propionate.
FIG. 2C is an illustrative micrograph of a panel expected after corrosion testing of a panel having a coating that includes about 4 wt. % OTSE and about 0.5 wt. % Zr propionate.
FIG. 2D is an illustrative micrograph of a panel expected after corrosion testing of a panel having a coating that includes about 8 wt. % OTSE and about 0.5 wt. % Zr propionate.

Experiments were repeated using several OTSE concentrations. FIGS. 2A, 2B, 2C, and 2D illustrate the corrosion test results. These coatings were also able to be bent 90° without exhibiting cracking. FIGS. 2A, 2B, 2C, and 2D are micrographs of surfaces after 200 hours in a corrosion bath. The results for OTSE coating systems with compositions containing 2 wt % OTSE with 0.5 wt % Ce prop. is shown in FIG. 2A, 4 wt % OTSE with 0.5 wt % Ce prop. is shown in FIG. 2B, 4 wt % OTSE with 0.5 wt % Zr prop. Is shown in FIG. 2C, and 8 wt % OTSE with 0.5 wt % Zr prop is shown in FIG. 2D. These micrographs are taken at 10× magnification.

Example 3

Figure 3:
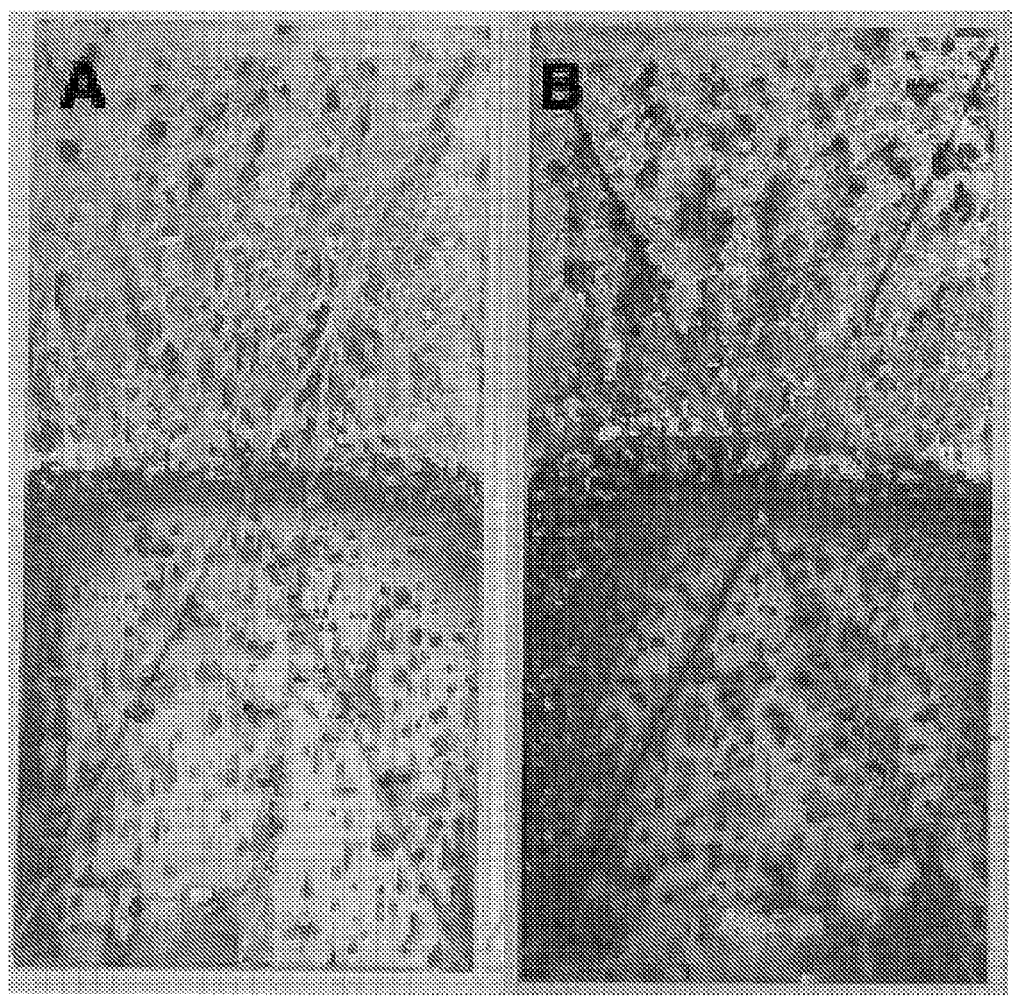
FIG. 3A is an illustrative micrograph of a panel expected after corrosion testing of a panel that is treated with only Ce proprionate and not OTSE.
FIG. 3B is an illustrative micrograph of a panel expected after corrosion testing of a panel that is treated with only Zr proprionate and not OTSE.

At this point, the OTSE coating system are observed to successfully inhibit corrosion with the addition of rare earth precursors. Next, experiments are designed to understand the relationship of the two components, the OTSE and the corrosion inhibitors. Panels are coated with the corrosion inhibitors dissolved in the coating solvent without OTSE. Upon completion of the corrosion test the panel is highly corroded as seen below in FIGS. 3A and 3B. This experiment shows that the rare earth precursors by themselves generally do not inhibit corrosion. FIGS. 3A and 3B are images of panels after 200 hours in a corrosion bath. FIGS. 3A and 3B correspond respectively to the Ce prop. with no OTSE, and the Zr prop. with no OTSE.

Example 4

Figures 4A, 4B:
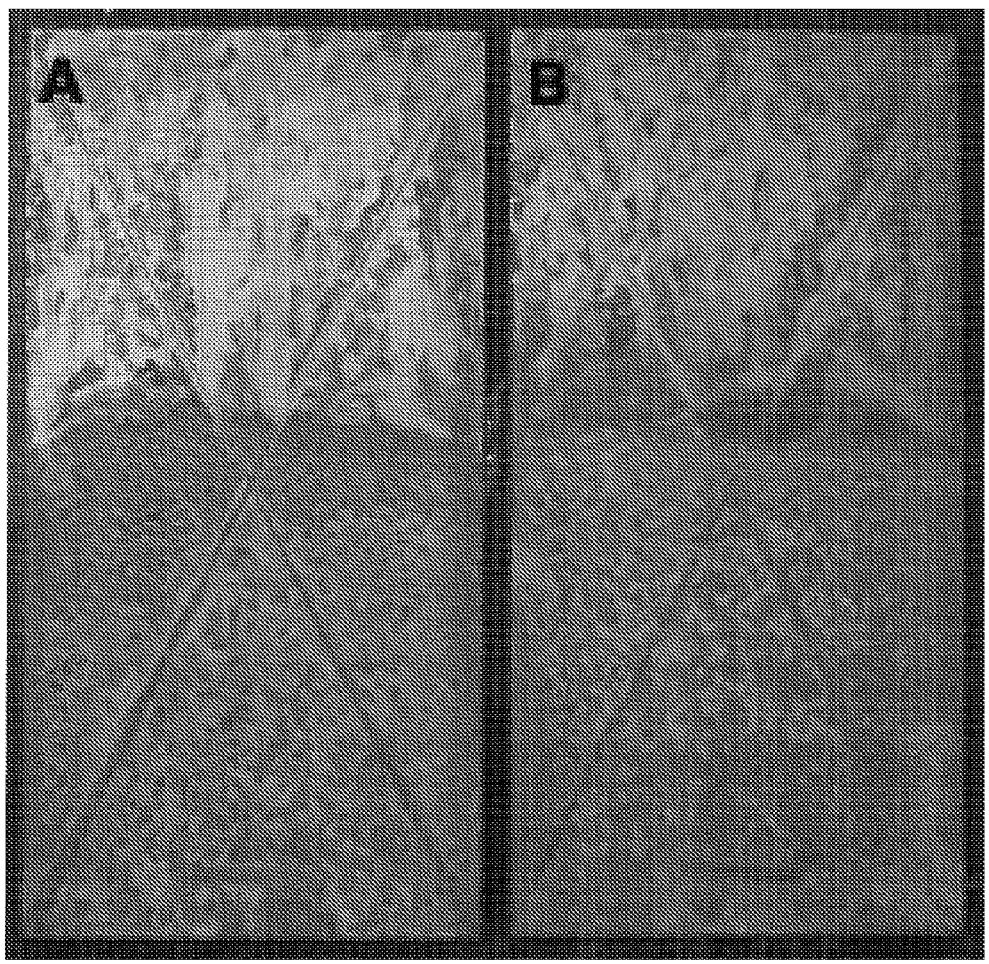
FIG. 4A is an illustrative micrograph of a panel expected after corrosion testing of a panel that is treated with 4 wt. % of a silica reagent, Silbond 40, and Ce proprionate.
FIG. 4B is an illustrative micrograph of a panel expected after corrosion testing of a panel that is treated with 4 wt. % of a silica reagent, Silbond 40, and Zr proprionate.

To contrast the OTSE coatings the silica reagent, Silbond 40 (S40), containing 40 wt % $SiO_2$ as a partially hydrolyzed $Si(OEt)_4$ is tested with RE precursors at 4 wt % S40 hydrolyzed normally. FIGS. 4A and 4B illustrates that the S40 coatings corrode severely, showing that silica alone generally does not inhibit corrosion. FIGS. 4A and 4B are images of panels after 200 hour corrosion test for 4 wt % S40 with Ce prop., and 4 wt % S40 with Zr prop, respectively.

Example 5

Coatings made via the general procedure for corrosion studies above are tested after 7 days for hardnesses using an Elcometer 501 pencil hardness tester in accordance with ASTM D 3363. The hardnesses of the different coating systems are listed in Table 1. Note ranking from hardest to softest is as follows:

6H>-->H>F>HB>B>-->6B

TABLE 1

Pencil hardness data (data reported are an average of six to nine measurements).

| Coating | Hardness |
|---------|----------|
| OTSE    | ≧6H      |
| TCTSE   | ≧6H      |
| TGTSE   | 5-6H     |
| TOETSE  | 5-6H     |
| TCPTSE  | 2-3H     |

Examples of Bactericidal, Hard Coatings
General:
The standard procedures for preparing bactericidal coatings are as follows. First, 0.2 g (0.08 mmol), 0.4 g (0.16 mmol), 0.8 g (0.32 mmol), or a larger amount of SQ material in 12.5 ml of solvent consisting of 0-100% alcohol and 100-0% ketone to make 2, 4, 8 wt %, or higher SQ solutions. After the SQ material is dissolved, 0.1-10.0 ml of a concentrated strong acid (e.g., concentrated nitric acid (such as about 50-70 wt %) or concentrated hydrochloric acid (such as about 33-40 wt %)) in 10-100 ml water solution is added and the solution is allowed to stir for 5-300 min. For example an acid solution may be made having a pH of about 1-2 (e.g., for a solution of about 1:100 HCl:H2O). Then, a small amount, 0.01-0.80 g (0.01-0.8 mmol), of a salt of a transition metal ion such as silver, copper, zinc, and gold is added to the solution. The solution is allowed to stir for 1-500 minutes and then can be spray, dip or brush coated onto metals such as steels, aluminum, magnesium, glass, ceramics and cloth. Or a SQ material can act as a carrier for the metal ions in the first layer of a coating system to which a second coating is added that reacts with the metal ions. A suitable solvent may be employed, and thus may result in a coating solution with a pH of about 4.

Example 6

A coating consisting of 4 wt % of either OTSE or TTSE with (0.01-0.2 mmol) of silver nitrate, acetate or trifluoroacetate or other carboxylate is sprayed, dipped or brushed onto metal substrates. On metal substrates these coatings are ≧6H hard. The coatings are allowed to dry and cure at ambient for several hours to several days or alternately heated to 30° to 400° C. for 1-4 h until they exhibit high hydrophobic properties.

Example 7

Figure 5A:
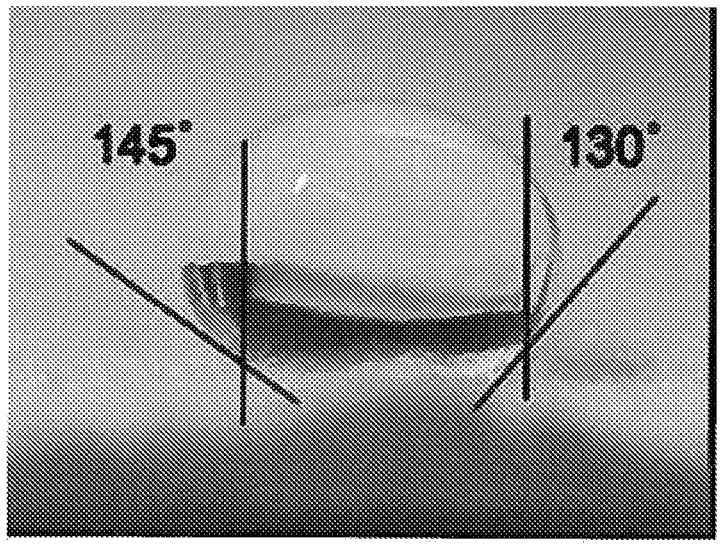
FIG. 5A is an illustrative micrograph of an expected contact angle for a cotton cloth coated with a coating having about 4 wt. % TTSE and about 0.1 wt. % silver nitrate.
Figure 5B:
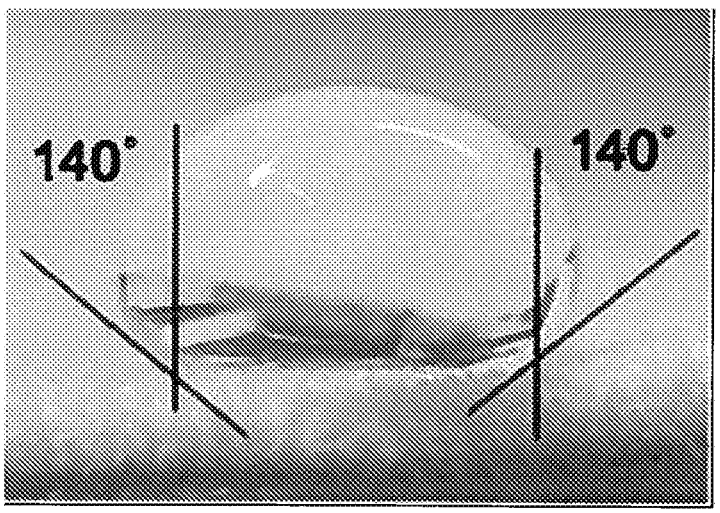
FIG. 5B is an illustrative micrograph of an expected contact angle for a cotton cloth coated with a coating having about 4 wt. % OTSE and about 0.1 wt. % silver nitrate.

A coating consisting of 4 wt % of either OTSE or TTSE with (0.01-0.2 mmol) of silver nitrate, acetate or trifluoroacetate or other carboxylate is sprayed, dipped or brushed onto cloth. When these coatings are applied to cotton cloth and heated to about 30-200° C. for about 1-4 hour (h) until they exhibit high hydrophobic properties. Uncoated cotton readily absorbs water and therefore has a water contact angle of about 0°. As shown in FIGS. 5A and 5B, cotton cloth coated with SQ materials of the invention may have water contact angles on the order of about 130-145°. A color change of the cloth (e.g., from white to reddish brown) may also be observed with the coatings (e.g., with a TTSE coating). FIGS. 5A and 5B are images illustrating the contact angles for cotton cloth coated with 4 wt % TTSE with 0.1 wt % silver nitrate (left) and 4 wt % OTSE with 0.1 wt % silver nitrate (right). Similar results are expected with other combinations SQs and transitional metal salt ions described herein.

Example 8

Figure 6:
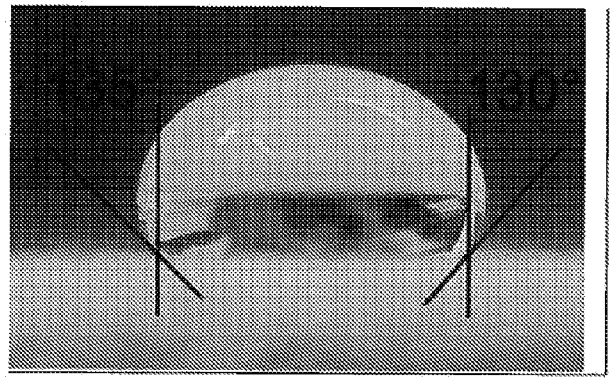
FIG. 6 is an illustrative micrograph of an expected contact angle for a cotton cloth first coated with a coating having about 4 wt. % OTSE and about 0.1 wt. % silver nitrate, then heated and then coated with a coating containing about 1 wt. % TTSE.

A coating consisting of 4 wt % OTSE with 0.01-0.10 g (0.01-0.2 mmol) of silver nitrate is sprayed onto cotton cloth. Thereafter the cloth is heated to 100-200° C. for 1-4 h After cooling the coated cloth is spray coated with a 1 wt % TTSE coating. On spraying a white to reddish brown color change is observed indicating the formation of colloidal silver. As shown in FIG. 6, cotton cloth coated in this manner has water contact angles of about 130-135°. Similar results are expected with other combinations of SQs and transitional metal salt ions described herein.

FIG. 6 is an image that illustrates the contact angles of cotton cloth coated with 4 wt % OTSE with 0.1 wt % silver nitrate, heated and then coated with 1 wt % TTSE. Similar results are expected with other combinations SQs and transitional metal salt ions described herein.

Example 9

A coating consisting of 4 wt % OTSE with 0.01-0.10 g (0.01-0.2 mmol) of silver nitrate is sprayed onto a metal substrate. Thereafter the substrate is heated to 100-200° C. for 1-4 h. After cooling the coated substrate is spray coated with a 1 wt % TTSE coating. On spraying a white to reddish brown color change is observed indicative of formation of colloidal silver known to offer bactericidal properties. The coated metal substrates exhibit ≧6H hardnesses. Similar results are expected with other combinations of SQs and transitional metal salt ions described herein.

Examples of Icephobic, Hard Coatings

General:

The standard procedures for preparing icephobic coatings are as follows. First, 0.2 g (0.08 mmol), 0.4 g (0.16 mmol), 0.8 g (0.32 mmol), or a larger amount of SQ material is dissolved in 12.5 ml of solvent consisting of 0-100% alcohol and 100-0% ketone to make 2, 4, 8 wt %, or larger SQ solutions. After the SQ material is dissolved, 0.1-10.0 ml of a concentrated strong acid (e.g., concentrated nitric acid (such as about 50-70 wt %) or concentrated hydrochloric acid (such as about 33-40 wt %)) in 100 ml water solution is added and allowed to stir for 5-300 min. For example an acid solution may be made having a pH of about 1-2 (e.g., for a solution of about 1:100 HCl:H2O). Then, the solution can be spray or dip coated onto steels, aluminum, magnesium, and cloth. A suitable solvent may be employed, and thus may result in a coating solution with a pH of about 4.

Example 10

A coating consisting of 4 wt % OTSE is sprayed onto aluminum substrates and allowed to cure at between about −5 and 250° C. for about 4-72 h. Water is sprayed onto a substrate from a squeeze bottle. The water beads into droplets. For comparison, an uncoated aluminum substrate is also sprayed with water, which pools instead of forming beads. The substrates were then cooled to −5° C. until the water freezes. Upon removal from the freezer the time it took for the ice to fall off of the substrates from gently tapping is recorded. The ice on the uncoated substrate takes about 115 seconds (s) to fall off and streaks of water remained. The ice on the coated substrate takes less than about one half that time (e.g., about 55 s) to fall off with almost no trace of water left behind. Images of the substrates showing ice formation and end results are shown in FIG. 7.

Figure 7:
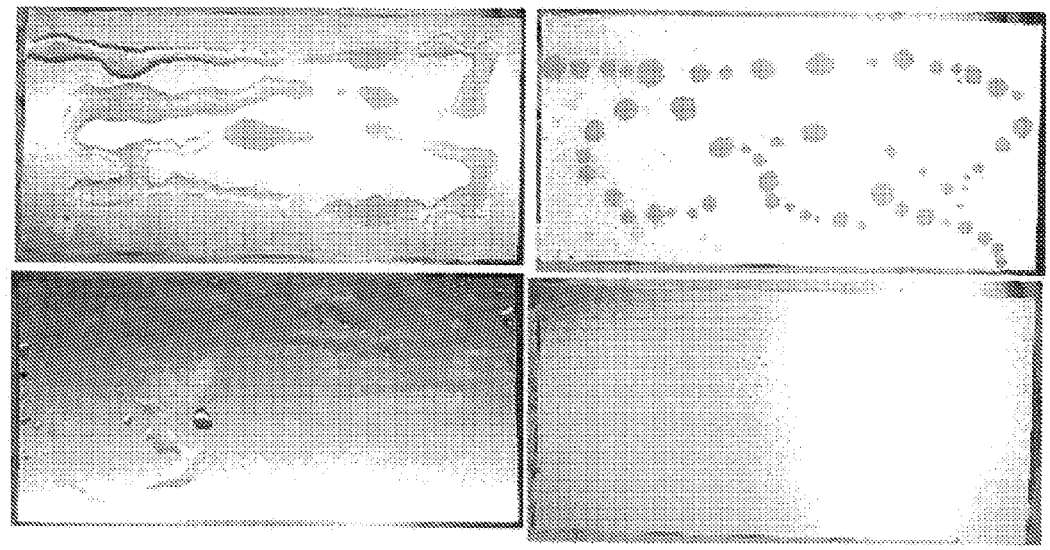
FIG. 7 are illustrative micrographs of vertical surfaces expected for ice on an uncoated aluminum surface (top-left), residual water on an uncoated aluminum surface (bottom left) after heating for 115 seconds, beads of ice on an aluminium surface coated with OTSE (top right), and the aluminum surface coated with OTSE after heating for 55 seconds upon which all of the beads of ice have fallen off.

The top left of FIG. 7 is an image of ice on uncoated aluminum. The bottom left of FIG. 7 is an image after 115 seconds of residual water after ice falling off the uncoated aluminum. The top right of FIG. 7 is an image of ice beads on OTSE coated aluminum. The bottom right of FIG. 7 is an image after 55 seconds illustrating that all of the ice beads fall off the coated aluminum with almost no residual water. Similar results are expected with other combinations of SQs and acids described herein.

OTSE, TTSE and TOETSE and coatings made from them using procedures similar to the general procedure shown above are tested for thermal stability. Note crosslinked hydrolzed oligomers made from all these materials are thermally stable to temperatures>400° C., reaction (5). Given their hardnesses, they are found to be very abrasion resistant.

Examples of Thin Film and NIL Processing

General:

The standard procedures for preparing thin films and patterned films using nanoimprint lithography (NIL) are as follows. First, to a stirred tetrahydrofuran (THF, 6 mL) in a 50 mL round bottom flask, SQs (0.1 to 10.0 mmol) is added followed by adding droppwise a mixture of distilled water ($H_2O$) and hydrochloric acid (HCl, 1 M) while stirring at 0° C. The molar ratio of the reaction mixture is 1:0.2:50 [SQs:HCl:$H_2O$]. After stirring the reaction mixture for 0.2-10 h at room temperature, the reaction mixture is poured into a solvent system consisting of ethers or ketones and ethers and water, resulting in a phase separation. The organic phase is recovered and stirred with magnesium sulfate ($MgSO_4$) for 30 min followed by filtering through 0.4 um PTFE syringe filter. Solvent is slowly evaporated by a rotary evaporator. The remaining product is diluted and used to form about 300 nm thick films by spin coating under selected conditions.

Example 11

Direct Thermal NIL of SQs

SQ films are prepared from solution by spin coating onto either Si or quartz wafer at 1500 rpm for 20 sec. Substrates are cleaned under UV-Ozone for 5 min before spin-coating. Then, films are subjected into a conformal contact with the $SiO_2$ molds in an imprint machine (NX-2000, Nanonex Inc.). After evacuating the sample chamber for 2 min, the imprints are made in two steps: 1-60 seconds at 100° C. and 0.1 to 5 MPa followed by 1-20 min at 170° C. and 0.1 to 10 MPa. The imprint tool then is cooled to between 0 and 100° C. before releasing the pressure and separating the pattern from the mold. The SQ imprints are further vitrified at temperatures of 250-440° C. under $N_2$ environment for a period of 0.1 to 3.0 h with ramp rates of 1-10° C./min.

Example 12

Thermal NIL of Polymeric Materials

The imprints are made into poly(styrene) (PS, 18.7 kg/mol) or poly(methyl methacrylate) (PMMA, 17.9 kg/mol) standards (Polymer Laboratories). PS is dissolved in toluene and PMMA is dissolved in anisole or other suitable solvents with a concentration of between 1 to 15% by mass, respectively. The films are spun cast at 209 rad/s (2000 rpm) onto Si wafers with a native oxide surface. The spun cast films are baked under vacuum for 0.1 to 3 h at between 80 and 250° C. to remove the residual solvent before imprinting. The imprints are made on a NX-2000 imprint tool with either OTSE or TTSE imprints consisting of parallel line-and-space grating structures. The surface of SQ imprints is treated with a low-energy self-assembled monolayer deposited from tridecafluoro-1,1,2,2 (tetrahydroctyl)trichlorsilane or related compounds in the vapor phase to facilitates mold release, if necessary, especially for NIL of high aspect ratio patterns. In general, both OTSE and TTSE imprints can be used without deposition of low-surface energy release layer due to their low surface energy. After sufficiently evacuating the sample chamber, the imprints are made in two steps: 1-60 s at 50-190° C. and at 0.4-2.4 MPa followed by 0.1 to 15 min at about 80-300° C. and 0.5 to about 5.5 MPa. The imprint tool then is cooled to about 0-100° C., below the glass transition temperature of the resist, before releasing the pressure and separating the pattern from the mold.

Specular X-Ray Reflectivity (SXR)

SXR measurements are performed on a Philips X'PERT diffractometer using Cu—$K_\alpha$ X-ray radiation ($\lambda$=1.54 Å). The incident beam is focused with a curved mirror into a 4-bounce Ge [220] crystal monochromator before being incident onto the sample. The reflected beam is further conditioned with a 3-bounce Ge [220] crystal monochromator to help ensure the specular condition. The angular reproducibility of the goniometers that control the sample rotation and angular position of X-ray detector is about 0.0001°. The reflectivity is collected at 25° C. under vacuum for all samples.

Precision out-of-plane CTE measurements are made by thickness measurements of the thin films using SXR. The thickness of a film is determined from the spacing of the interference fringes. Each POSS film is placed in a specially designed vacuum chamber and the thickness is measured at four different temperatures; 25°, 75°, 125°, and 175° C. The reflectivity measurements are performed in vacuum of $10^{-6}$ Pa after annealing the film at the predetermined temperature for 1 hour. After the measurement at 175° C., the samples are cooled back to 25° C. and the measurements are repeated in order to confirm a reversible expansion and contraction behavior.

(5)

Figure 8A:
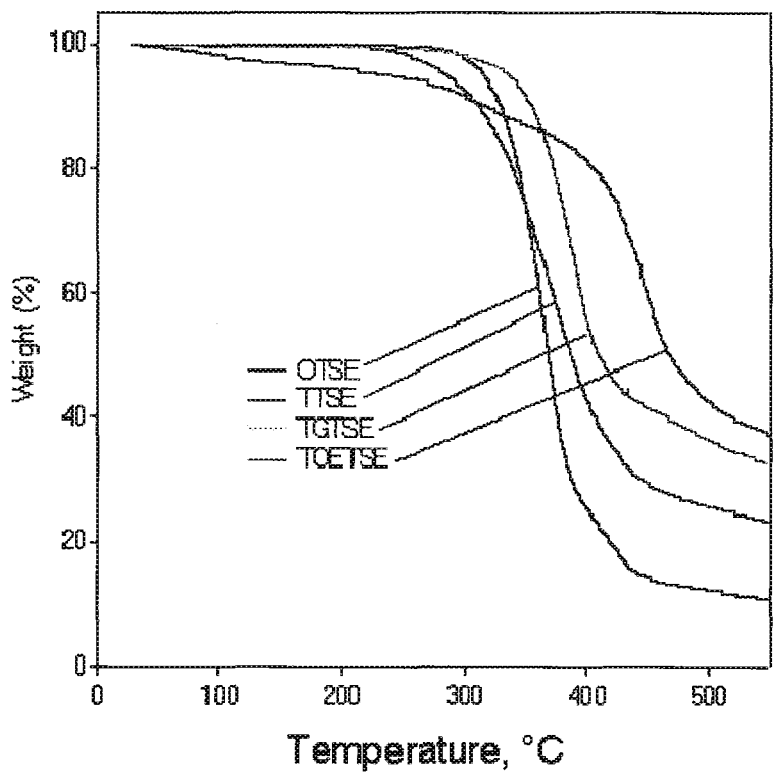
FIG. 8A are illustrative thermogravimetric analysis thermograms of the expected residual weight (in percentage of the initial weight) as a function of temperature of four monomers. At about 500° C., the order of residual weight from highest to lowest are: TOETSE monomer, TGTSE monomer, TTSE monmer, and OTSE monomer.
Figure 8B:
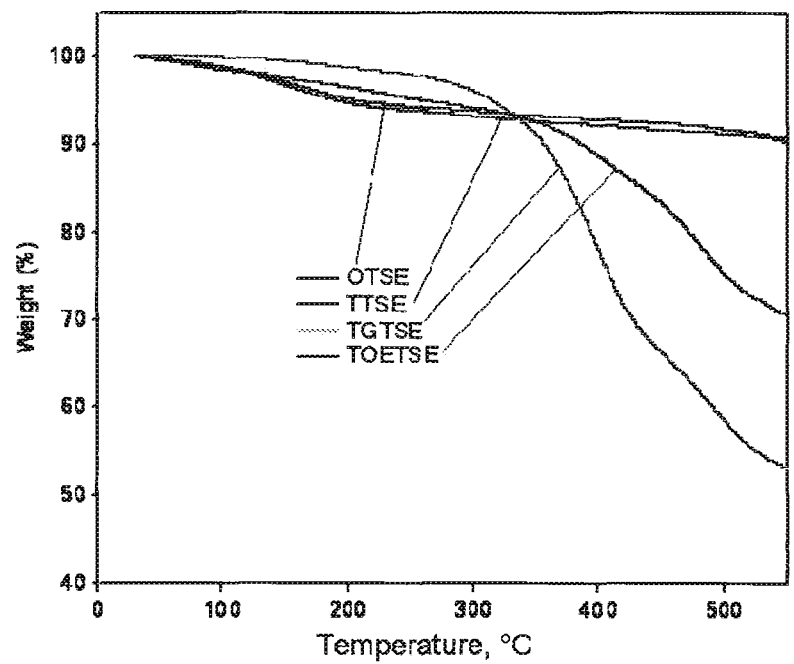
FIG. 8B are illustrative thermogravimetric analysis thermograms of the expected residual weight (in percentage of the initial weight) as a function of temperature of four oligomers. At about 500° C., the order of residual weight from highest to lowest are OTSE oligomer, TTSE oligomer, TGTSE oligomer, and TOETSE oligomer. Surprisingly the OTSE oligomer and TTSE oligomer have better thermal stability than TGTSE oligomer and TOETSE oligomer.

POSS Monomer $\xrightarrow[\text{Sol-gel reaction}]{H^+/H_2O}$ POSS Oligmer (terminated by Si—OH) Oligomer FIGS. 8A and 8B illustrate thermogravimetric analysis (TGA) thermograms of starting monomers, and hydrolyzed oligomers, respectively.

Example 13

OTSE, TTSE and TOETSE solutions made as above and spun coated with heating to 400° C. give excellent properties as shown in Table 2. Note that some part of the organic components of TOETSE may be expected to be lost during heating hence the much lower densities but much higher CTE of this material.

TABLE 2

Film properties determined by specular X-ray reflectivity (SXR) and nanoin-dentation of hydrolyzed, spun coated OTSE, TTSE and TOTSE and heated to >400° C.

| Sample | $\rho_{ave}$ (g/cm³) | $\rho_{wall}$ (g/cm³) | Porosity (%) | CTE ($10^{-6}$/K) | Modulus (GPa) |
|---|---|---|---|---|---|
| TTSE | 1.278 | 1.331 | 4.0 | 52 | 4.61 |
| OTSE | 1.257 | 1.357 | 7.4 | 29 | 5.78 |

TABLE 2-continued

Film properties determined by specular X-ray reflectivity (SXR) and nanoin-dentation of hydrolyzed, spun coated OTSE, TTSE and TOTSE and heated to >400° C.

| Sample | $\rho_{ave}$ (g/cm³) | $\rho_{wall}$ (g/cm³) | Porosity (%) | CTE ($10^{-6}$/K) | Modulus (GPa) |
|---|---|---|---|---|---|
| TGTSE | 1.252 | 1.289 | 2.9 | 244 | 1.21 |
| TOETSE | 1.209 | 1.318 | 8.3 | 136 | 2.16 |

Example 14

Figure 9:
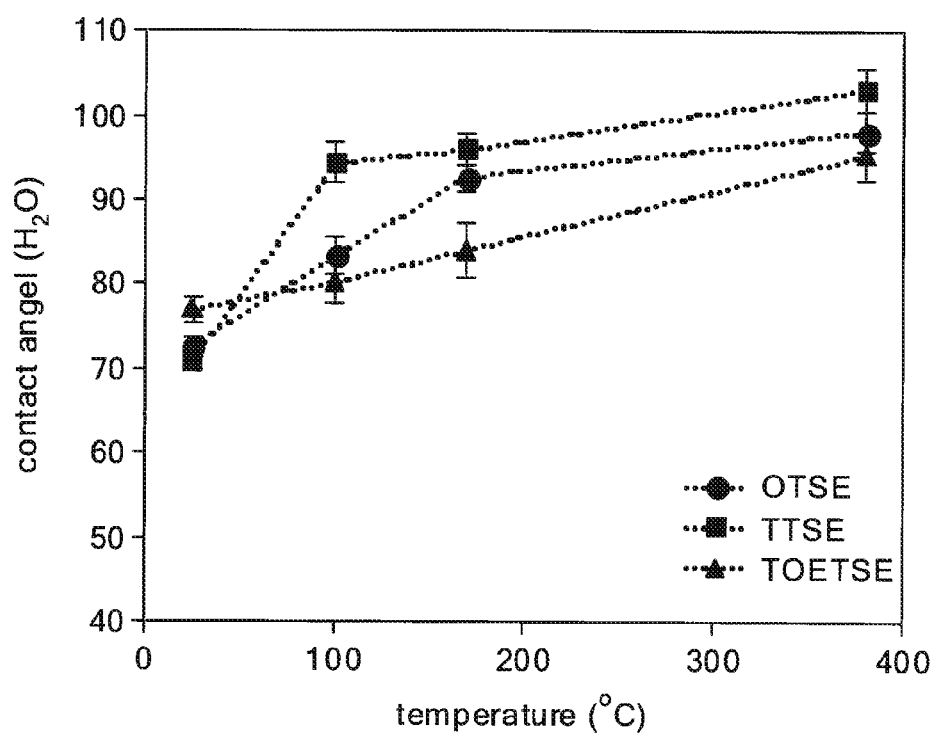
FIG. 9 illustrates the expected relationship between annealing temperature and the contact angle for different coatings.
Figure 10:
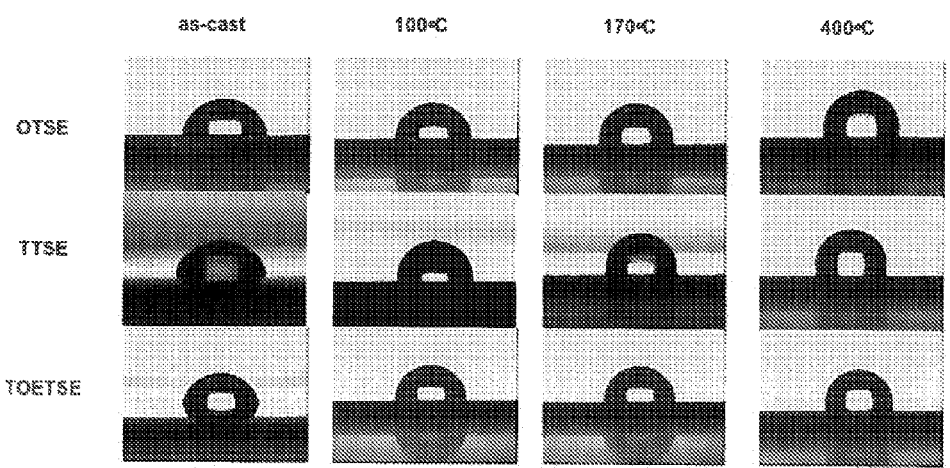
FIG. 10 are illustrative micrographs of expected contact angles for different coatings that are annealed at diffeent temperatures

OTSE, TTSE and TOETSE solutions made as above and spun coated with heating to 400° C. give excellent hydrophobic properties as seen in FIGS. 9 and 10.

FIG. 9 illustrates the static contact angle of water on POSS films after annealing the films. The contact angle of the POSS films is affected by the annealing temperature. The circular data points refer to OTSE, the square data points refer to TTSE, and the triangular data points refer to TOETSE. The samples are annealed at pre-determined temperatures for 10 min before cooling under $N_2$.

FIG. 10 illustates the contact angles of Janus films that after heating to different temperatures. Vitrification process following Janus imprinting leads to higher hydrophobic surface (CA ($H_2O$)≧100°). Higher carbon and Si—H content provide higher hydrophobic surfaces.

Example 15

Figure 11A:
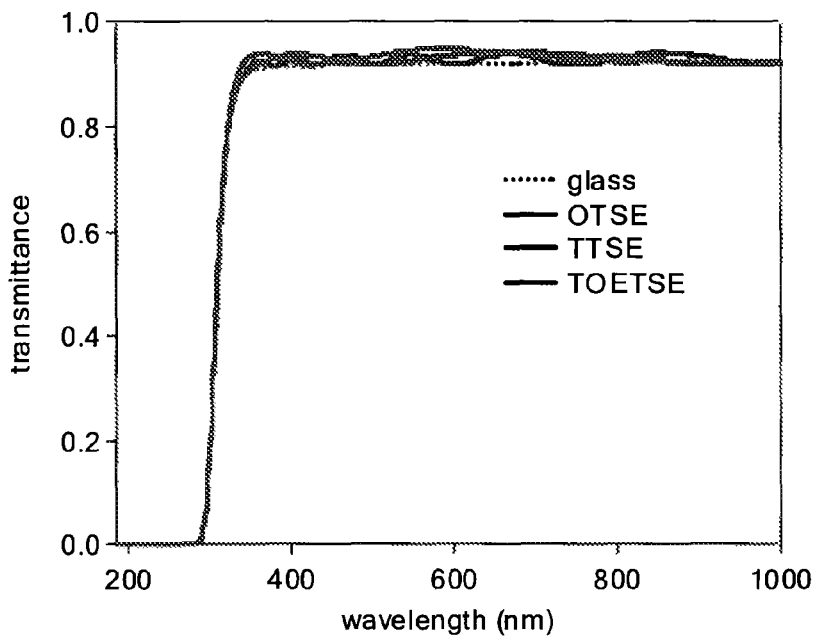
FIG. 11A illustrates the expected relationships between transmittance and UV light wavelength for glass, glass coated with OTSE, glass coated with TTSE, and glass coated with TOETSE.
Figure 11B:
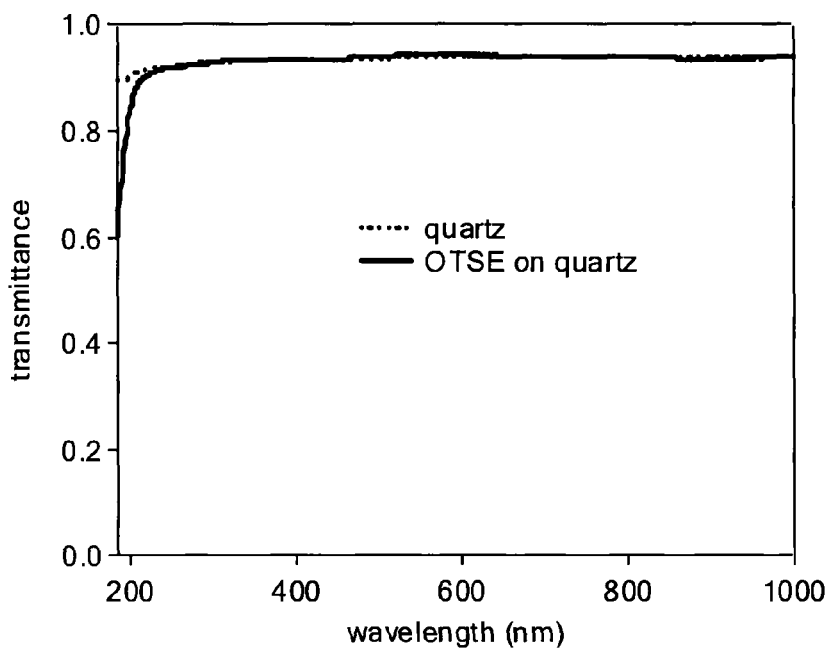
FIG. 11B illustrates the expected relationships between transmittance and UV light wavelength for quartz and quartz coated with OTSE.

OTSE, TTSE and TOETSE solutions made as above and spun coated with heating to 400° C. give excellent transparencies as shown in FIGS. 11A and 11B. Thus, UV light can be transmitted through coated structures or structured coatings of these materials to polymerize materials below them. They also offer potential for nanoimprint lithography NIL as suggested in examples below.

FIGS. 11A and B illustrates the transmittance of Janus materials deposited onto glass and quartz, respectively, in the wavelength range from 200 nm-1000 nm. Janus films show excellent transmittance in the wavelength over 185 nm. Janus patterns are promising candidates for molds in the UV-NIL.

Example 16

Hydrolyzed TTSE prepared as above is used to make a daughter mold for nanoimprint lithography in polystyrene. The data are presented in FIG. 12. FIG. 13 provides an example of imprinting into methylmethacrylate.

Figures 12A, 12B:
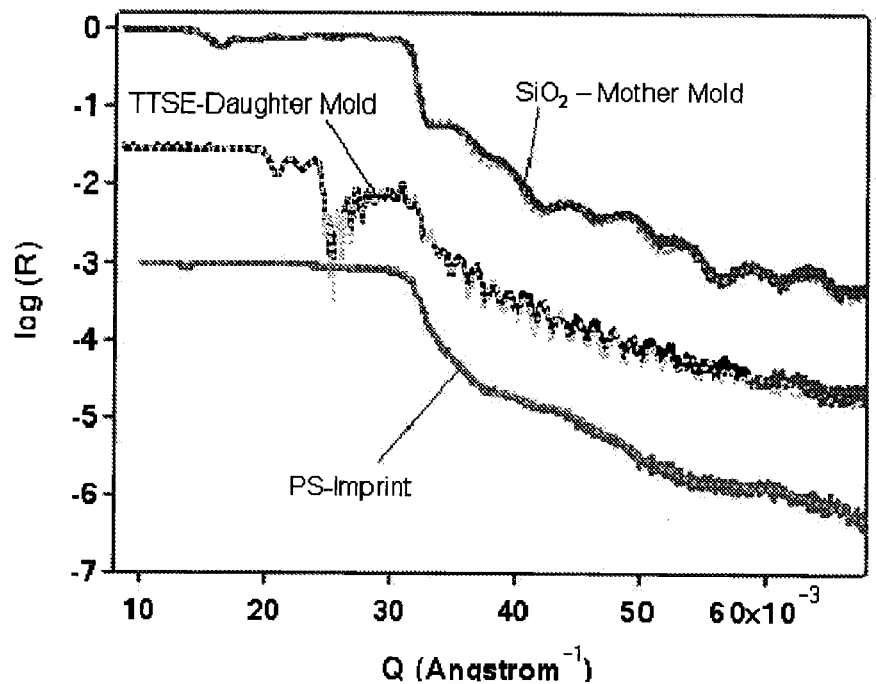
FIG. 12A illustrates specular x-ray reflectivity curves expected for a master $SiO_2$ mold (top curve), a TTSE replica (middle curve) and a PS imprint from the TTSE replica (bottom curve).
FIG. 12B illustrates the expected pattern height and the expected line-to-space ratios for the master mold ($SiO_2$), the replica (TTSE), and the imprint (PS).
Figure 12C:
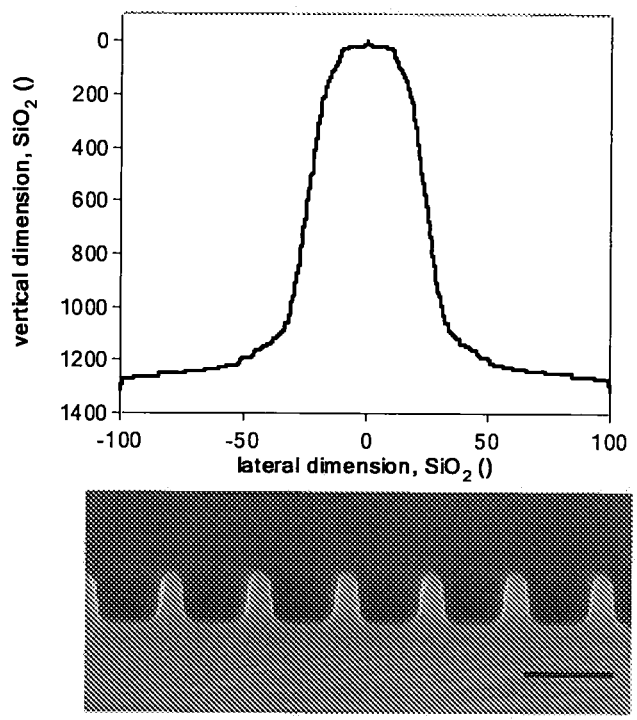
FIGS. 12C, 12D, and 12 E illustrate the expected cross-sectional patterns obtained from mitting the specular x-ray reflectivity curves (FIG. 12A) for the master mold ($SiO_2$), the replica (TTSE), and the imprint (PS), respectively.
Figure 12D:
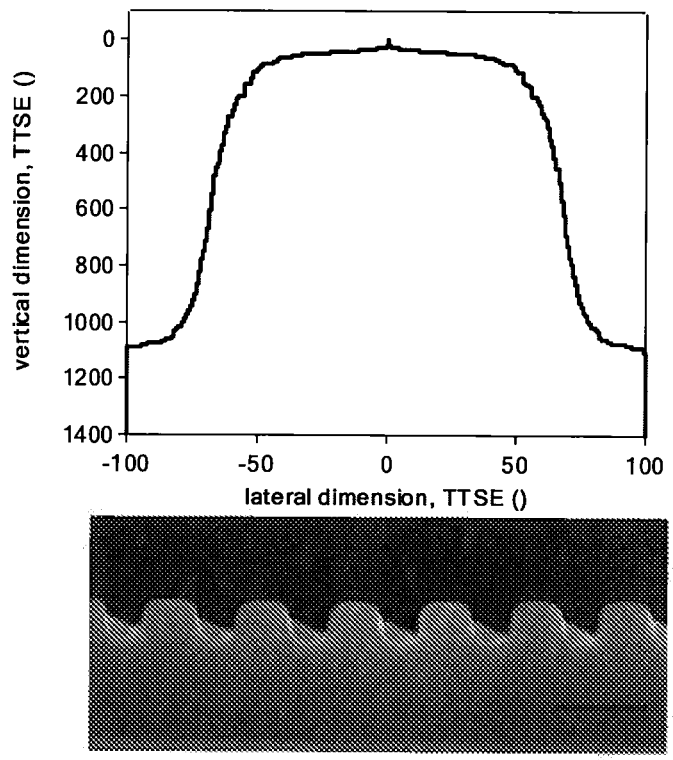
Figure 12E:
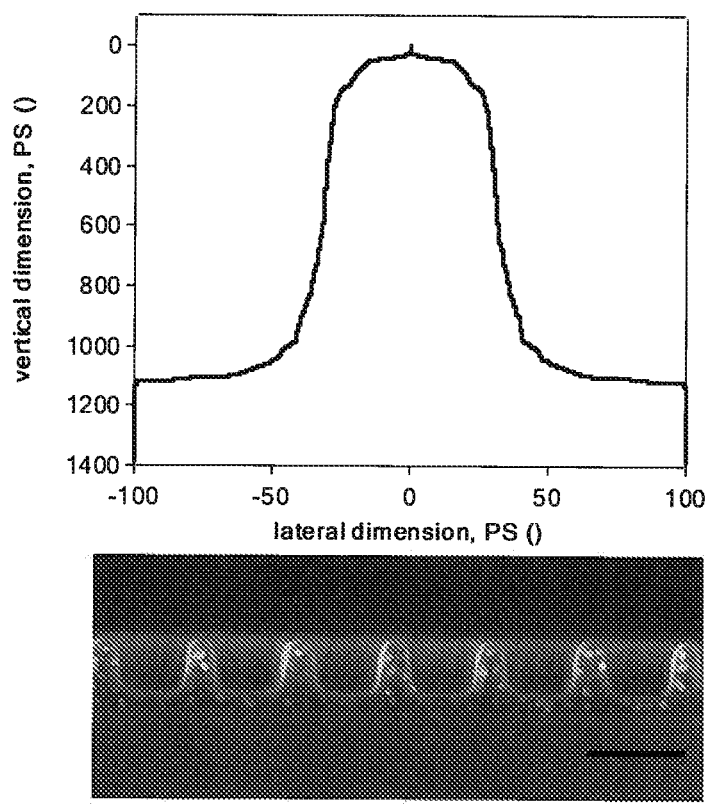
Figure 13:
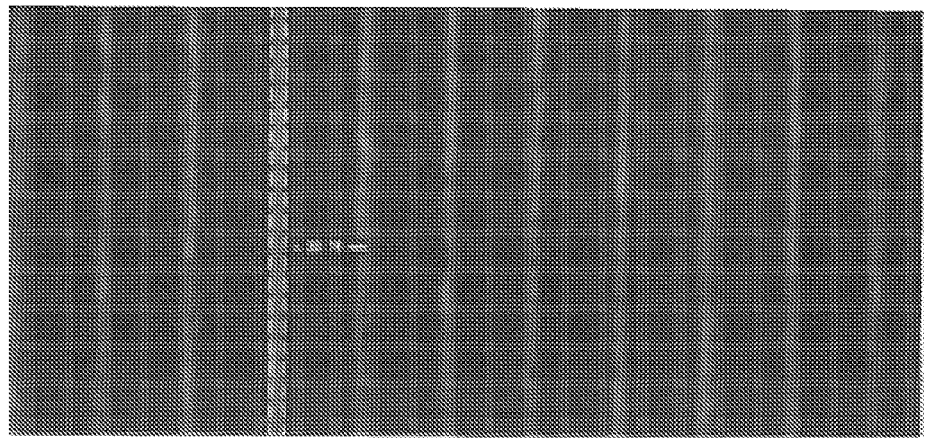
FIG. 13A is an illustrative FE-SEM image exected for a master $SiO_2$ grating pattern.
FIG. 13B is an illustrative FE-SEM image expected for a TTSE replica of the master grating pattern illustrated in FIG. 13A.
FIG. 13C is an illustrative FE-SEM image expected for a PMMA imprint from the TTSE replica illustrated in FIG. 13B.
FIG. 13D is an atomic force microscopy height image expected for the PMMA imprint.
FIG. 13E is another illustrative FE-SEM image expected for the PMMA imprint of FIG. 13C showing a larger region.
Figure 13:
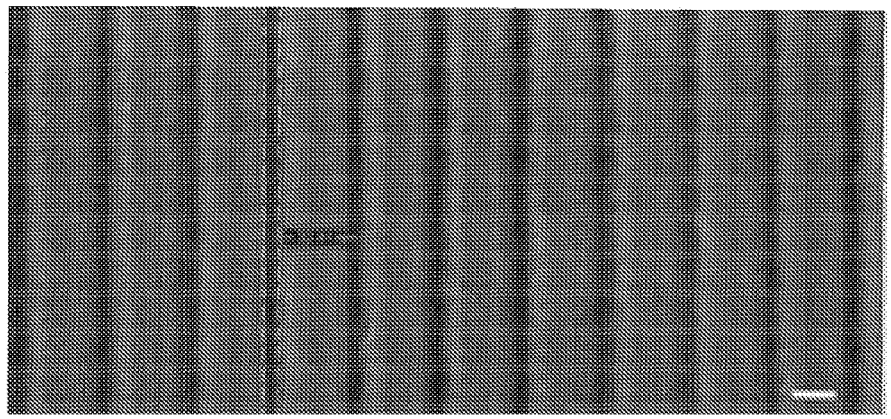
Figure 13:
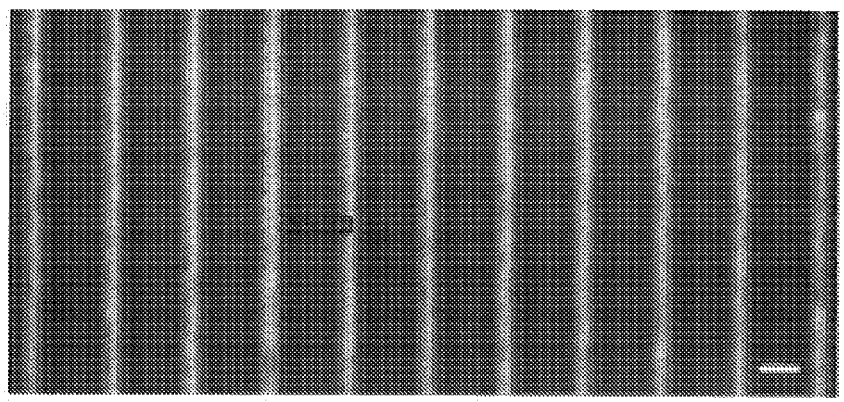

FIG. 12A illustrate the specular X-ray reflectivity curves for a master $SiO_2$ mold, a TTSE replica and a PS imprint from TTSE replica. The fitting results are drawn for each experimental curve. The pattern heights and line-to-space ratios from SXR are summarized in FIG. 12B. The cross-sectional pattern shapes deduced from density-depth profiles, which obtained from the fitting results of SXR, are drawn for the master $SiO_2$ mold, the TTSE replica, and the PS imprint from TTSE replica in FIGS. 12C, 12D, and 12E respectively. The cross-sectional FE-SEM images of each pattern are also shown in FIGS. 12C, 12D, and 12E (scale bar=200 nm).

Figure 13D:
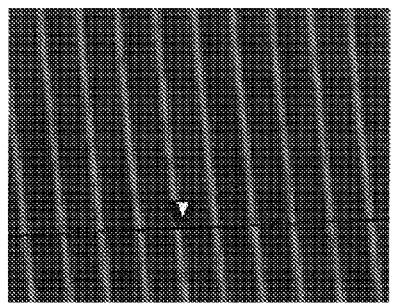
Figure 13D:
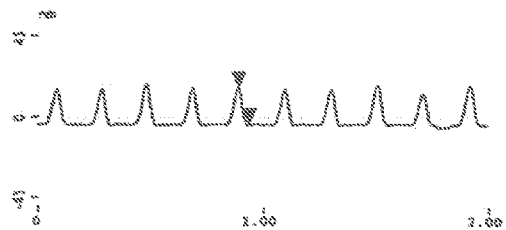
Figure 13E:
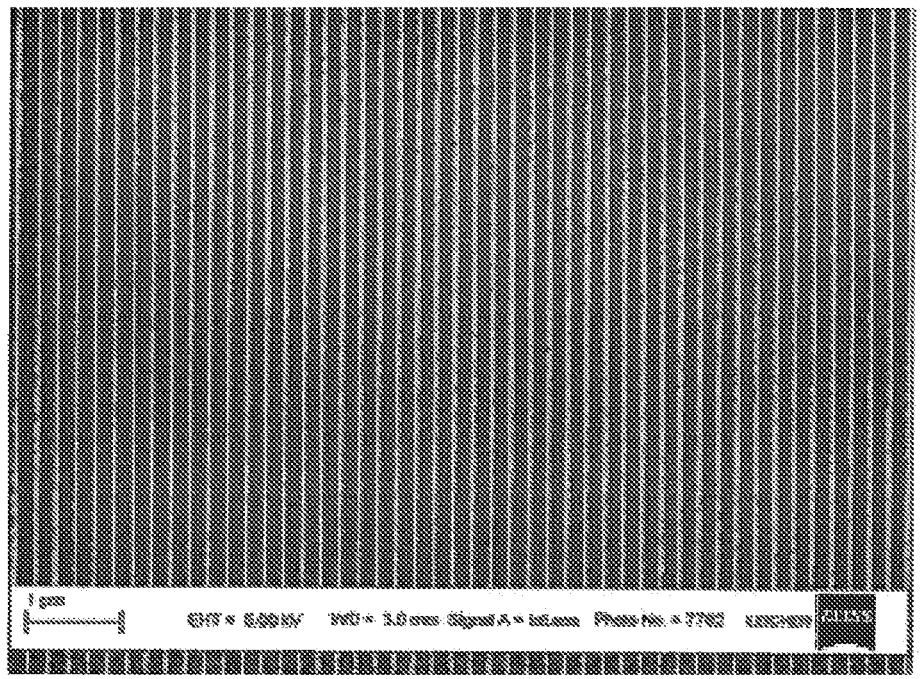

FIG. 13A is an illustrative FE-SEM image for master $SiO_2$ grating pattern with approximately 30 nm and 20 nm for line width, and pattern height, respectively. FIG. 13B is an illustrative FE-SEM image for TTSE replica of the master $SiO_2$ mold. FIG. 13C is an illustrative FE-SEM image for PMMA imprint from the TTSE replica. FIG. 13D is an illustrative AFM height image (2×2 micron2) for a PMMA imprint and is shown combined with the cross-sectional analysis data, which shows the pattern height is about 20 nm. FIG. 13E is an illustrative uniform PMMA imprint from a TTSE replica indicating the secondary PMMA patterns substantially uniformly in the large area without noticeable defect Example 16

The above spin coated and heated coatings are examined for their etch resistance for use in fabricating nanostructured imprinted features as shown in Table 3. The SQ materials show excellent etch selectivity compared with polymeric materials such as polystyrene. In fact the Janus materials are only etched in the initial RIE process and remain substantially the same thereafter probably due to the formation of surface $SiO_2$-like structures.

TABLE 3

Reactive ion etching (RIE) rates of SQ films for $O_2$ (50 W/50 mTorr/10 sccm) and $CHF_3$ (100 W/15 mTorr/50 sccm) sources.

| Sample | reactive ion etching (RIE) rate | |
|---|---|---|
| | $O_2$ RIE (nm/sec) | $CHF_3$ RIE (nm/sec) |
| TTSE | 0.0072 | 0.328 |
| OTSE | 0.0076 | 0.302 |
| TOETSE | 0.0189 | 0.371 |
| PS | 0.6946 | NA |

$O_2$ RIE rates of PS is also shown for comparison purpose, indicating that SQ films exhibit high etch selectivity with respect to polymeric material and are also processible under $CHF_3$ RIE condition.

What is claimed is:

1. A method of forming a coating, comprising the steps of:
    dissolving an silsesquioxane having a single cage structure with pendant $Si(OH)_x$ groups in a solvent to form a solution, where x is a natural integer between 1 and 3;
    introducing an additive including at least one salt of a transition metal ion in the solution; and
    applying the solution to a substrate to form a coating on the substrate,
    wherein the coating forms crosslinks between the pendant $Si(OH)_x$ groups and a substrate surface.

2. The method of claim 1, wherein the method includes dissolving one or more silsesquioxane oligomers to which are covalently bonded three or more alkyldialkoxy-, alkyltrialkoxy-, alkyldichloro- or alkyltrichloro-silane moieties in the solvent to form the solution;
    wherein the additive is to aid in wetting, aid in corrosion resistance, aid in coloring, add absorptive or decorative behavior, add biocidal or antiviral behavior, introduce surface roughness, or any combination thereof;
    the method further comprising adding water at a controlled pH, so that the pH of the solution is about 3 to about 5, generating multiple, pendant $alkylSi(OH)_x$ groups; and aging the solution to create crosslinking between these moieties and additive.

3. The method of claim 1, further comprising a step of dissolving the solution in a solvent selected from at least one of an alcohol, a ketone, an ether, water or any combination thereof.

4. The method of claim 1, further comprising a step of dissolving the solution in a solvent selected from at least one of from 0 to 100% by weight of at least one alcohol, and any balance of the solvent being at least one ketone.

5. The method of claim 1, wherein the additive includes the at least one salt of the transition metal ion selected from such as silver, copper, zinc, and gold.

6. The method of claim 1, wherein the additive is added in an amount of about 0.01-0.8 mmol per about 0.08 mmol of the silsesquioxane.

7. The method of claim 1, wherein the additive is added in an amount of about 0.01-0.8 mmol per about 0.32 mmol of the silsesquioxane.

8. The method of claim 1, wherein the additive is selected to aid in wetting, corrosion resistance, coloring, to add absorptive or decorative behavior, to add biocidal or antiviral behavior, to introduce surface roughness, or any combination thereof.

* * * * *